(12) United States Patent
Li et al.

(10) Patent No.: US 11,456,281 B2
(45) Date of Patent: Sep. 27, 2022

(54) ARCHITECTURE AND PROCESSES TO ENABLE HIGH CAPACITY MEMORY PACKAGES THROUGH MEMORY DIE STACKING

(71) Applicant: Intel Corporation, Santa Clara, CA (US)

(72) Inventors: Yi Li, Chandler, AZ (US); Zhiguo Qian, Chandler, AZ (US); Prasad Ramanathan, Chandler, AZ (US); Saikumar Jayaraman, Chandler, AZ (US); Kemal Aygun, Tempe, AZ (US); Hector Amador, Chandler, AZ (US); Andrew Collins, Chandler, AZ (US); Jianyong Xie, Chandler, AZ (US); Shigeki Tomishima, Portland, OR (US)

(73) Assignee: Intel Corporation, Santa Clara, CA (US)

(*) Notice: Subject to any disclaimer, the term of this patent is extended or adjusted under 35 U.S.C. 154(b) by 852 days.

(21) Appl. No.: 16/147,742

(22) Filed: Sep. 29, 2018

(65) Prior Publication Data
US 2020/0105719 A1 Apr. 2, 2020

(51) Int. Cl.
*H01L 25/065* (2006.01)
*H01L 25/10* (2006.01)
*H01L 25/00* (2006.01)

(52) U.S. Cl.
CPC ........ *H01L 25/0657* (2013.01); *H01L 25/105* (2013.01); *H01L 25/50* (2013.01); *H01L 2225/0652* (2013.01); *H01L 2225/06541* (2013.01); *H01L 2225/06562* (2013.01); *H01L 2225/1041* (2013.01); *H01L 2225/1058* (2013.01)

(58) Field of Classification Search
CPC .................................................. H01L 25/0657
See application file for complete search history.

(56) References Cited

U.S. PATENT DOCUMENTS

| | | | | |
|---|---|---|---|---|
| 2015/0206866 A1* | 7/2015 | Yu | ........................... | H01L 24/81 438/109 |
| 2016/0071818 A1* | 3/2016 | Wang | ...................... | H01L 25/18 257/773 |
| 2016/0099231 A1* | 4/2016 | Yang | ................... | H01L 23/5389 257/774 |

* cited by examiner

*Primary Examiner* — Christopher A Johnson
(74) *Attorney, Agent, or Firm* — Schwabe, Williamson & Wyatt, P.C.

(57) ABSTRACT

Embodiments include electronic packages and methods of forming such packages. An electronic package includes a memory module comprising a first memory die. The first memory die includes first interconnects with a first pad pitch and second interconnects with a second pad pitch, where the second pad pitch is less than the first pad pitch. The memory module also includes a redistribution layer below the first memory die, and a second memory die below the redistribution layer, where the second memory die has first interconnects with a first pad pitch and second interconnects with a second pad pitch. The memory module further includes a mold encapsulating the second memory die, where through mold interconnects (TMIs) provide an electrical connection from the redistribution layer to mold layer. The TMIs may be through mold vias. The TMIs may be made through a passive interposer that is encapsulated in the mold.

16 Claims, 20 Drawing Sheets

ARCHITECTURE AND PROCESSES TO ENABLE HIGH CAPACITY MEMORY PACKAGES THROUGH MEMORY DIE STACKING

FIELD

Embodiments of the present disclosure relate to electronic packaging, and more particularly, to electronic packages that enable high capacity memory packages through memory die stacking, including low capacity, high bandwidth single die dynamic random-access memory (DRAM) memory architectures and interfaces.

BACKGROUND

The past several decades, the scaling of features in integrated circuits has been a driving force behind an ever-growing semiconductor industry. Scaling to smaller and smaller features enables increased densities of functional units on the limited real estate of semiconductor devices. For example, shrinking transistor size allows for the incorporation of an increased number of memory devices on a chip, lending to the fabrication of products with increased capacity. The drive for ever-more capacity, however, is not without issue. The necessity to optimize the performance of each device becomes increasingly significant.

The drive to scale integrated circuits, such as microprocessors, has been increasingly obtained through the use of memory packages. The formation of such current high bandwidth memory package technologies are typically aligned with high capacity needs. This formation, however, leads to increased costs and significantly limited supplier chains.

Meanwhile, as existing memory packages technologies are focused on packaging solutions with high bandwidth and high capacity, the available packaging solutions for addressing low capacity, high bandwidth technology needs is limited. For example, in high-end memory products, the current packaging solutions for high-bandwidth memory (HBM) to logic die communication may be achieved via a die bridge or a silicon interposer. For current HBM technologies, the high-end memory packaging solutions generally require higher bandwidths that are associated with higher capacities, through silicon via (TSV) based stacking, large power requirements, and increased costs.

Other existing memory packaging solutions may utilize off-chip high density memories (e.g., a commodity HBM DRAM) or conventional DRAMs. These existing memory packaging solutions nevertheless have limitations and problems. With respect to an off-chip dense memory such as a stand-alone DRAM or a non-volatile memory, these memory packages improve in memory size but has reduced operating speeds and limited bandwidth, as the input/output (I/O) between the off-chip memory and the central processing unit (CPU) is limited. Therefore, the advantage of increased memory size does not enable performance gains—and thus limits the off-chip dense memory.

In respect to a conventional DRAM, these memory packages design and position the memory bit cells next to logic transistors using a process that is challenging to scale. Another memory packaging solution involves increasing the DRAM bank number, but this solution is substantially expensive due to the area overhead. As a result, increasing the DRAM bank number s generally associated with large die size increase, which lends itself to large capacities and increased prices.

BRIEF DESCRIPTION OF THE DRAWINGS

Embodiments described herein illustrated by way of example and not limitation in the figures of the accompanying drawings, in which like references indicate similar features. Furthermore, some conventional details have been omitted so as not to obscure from the inventive concepts described herein.

DETAILED DESCRIPTION

Figure 1A:
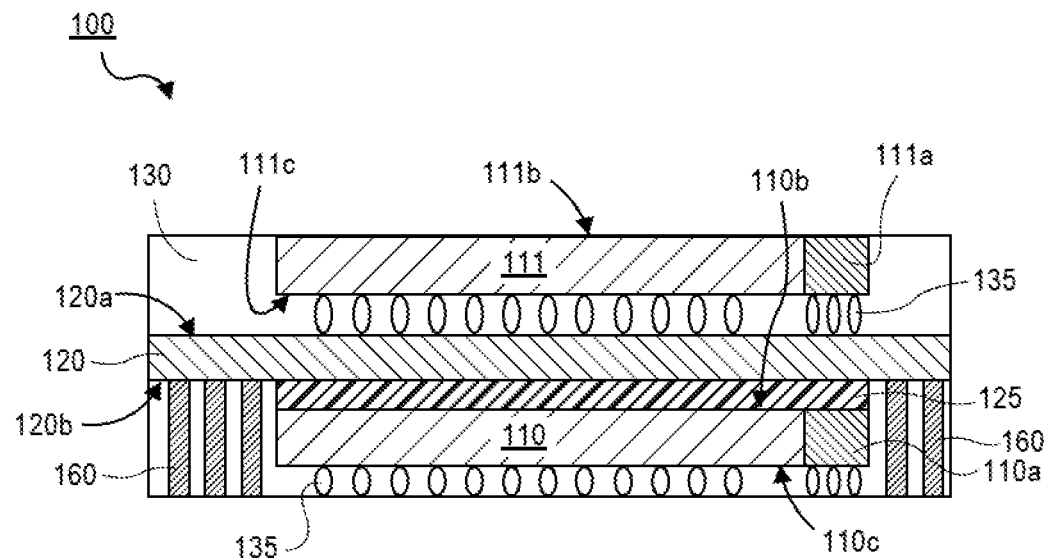
FIG. 1A is a cross-sectional illustration of a memory module with through mold vias, in accordance with an embodiment.

Described herein are electronic packages that enable high capacity memory packages through memory die stacking and methods of forming such electronic packages. As such, some of the embodiments described below enable package architectures and processes that stack memory dies (e.g., one or more high bandwidth low latency (HBLL) memory dies) with redistribution layers, trough mold vias, and/or passive silicon interposers with through silicon vias to achieve high bandwidth memory packages with increased memory capacity. In the following description, numerous specific details are set forth, such as specific material and tooling regimes, in order to provide a thorough understanding of embodiments of the present disclosure.

It will be apparent to one skilled in the art that embodiments of the present disclosure may be practiced without these specific details. In other instances, well-known features, such as integrated circuit design layouts such as single or dual damascene processing, are not described in detail in order to not unnecessarily obscure embodiments of the present disclosure. Furthermore, it is to be understood that the various embodiments shown in the Figures are illustrative representations and are not necessarily drawn to scale. In some cases, various operations will be described as multiple discrete operations, in turn, in a manner that is most helpful in understanding the present disclosure, however, the order of description should not be construed to imply that these operations are necessarily order dependent. In particular, these operations need not be performed in the order of presentation.

As used herein, the terms "top," "bottom," "upper," "lower," "lowermost," and "uppermost" when used in relationship to one or more elements are intended to convey a relative rather than absolute physical configuration. Thus, an element described as an "uppermost element" or a "top element" in a device may instead form the "lowermost element" or "bottom element" in the device when the device is inverted. Similarly, an element described as the "lowermost element" or "bottom element" in the device may instead form the "uppermost element" or "top element" in the device when the device is inverted.

Likewise, certain terminology may also be used in the following description for the purpose of reference only, and thus are not intended to be limiting. For example, terms such as "upper", "lower", "above", "below," "bottom," and "top" refer to directions in the drawings to which reference is made. Terms such as "front", "back", "rear", and "side" describe the orientation and/or location of portions of the component within a consistent but arbitrary frame of reference which is made clear by reference to the text and the associated drawings describing the component under discussion. Such terminology may include the words specifically mentioned above, derivatives thereof, and words of similar import.

Embodiments described herein may be directed to front-end-of-line (FEOL) semiconductor processing and structures. FEOL is the first portion of integrated circuit (IC) fabrication where the individual devices (e.g., transistors, capacitors, resistors, etc.) are patterned in the semiconductor substrate or layer. FEOL generally covers everything up to (but not including) the deposition of metal interconnect layers. Following the last FEOL operation, the result is typically a wafer with isolated transistors (e.g., without any wires).

Embodiments described herein may be directed to back end of line (BEOL) semiconductor processing and structures. BEOL is the second portion of IC fabrication where the individual devices (e.g., transistors, capacitors, resistors, etc.) are interconnected with wiring on the wafer, e.g., the metallization layer or layers. BEOL includes contacts, insulating layers (dielectrics), metal levels, and bonding sites for chip-to-package connections. In the BEOL part of the fabrication stage contacts (pads), interconnect wires, vias and dielectric structures are formed. For modern IC processes, more than 10 metal layers may be added in the BEOL.

Embodiments described below may be applicable to FEOL processing and structures, BEOL processing and structures, or both FEOL and BEOL processing and structures. In particular, although an exemplary processing scheme may be illustrated using a FEOL processing scenario, such approaches may also be applicable to BEOL processing. Likewise, although an exemplary processing scheme may be illustrated using a BEOL processing scenario, such approaches may also be applicable to FEOL processing.

These electronic devices described herein may be implemented in one or more components associated with an integrated circuit (IC) and/or between various such components. As described herein, the terms chip, integrated circuit (IC), monolithic device, semiconductor device, semiconductor package, and microelectronic device, are often used interchangeably in the semiconductor packaging field, and thus the embodiments described herein may be applicable to all of the above as known in this field.

In various embodiments, components associated with an IC include, for example, transistors, diodes, power sources, resistors, capacitors, inductors, sensors, transceivers, receivers, antennas, etc. Components associated with an IC may include those that are mounted on IC or those connected to an IC. The IC may be either analog or digital and may be used in a number of applications, such as microprocessors, optoelectronics, logic blocks, audio amplifiers, etc., depending on the components associated with the IC. The IC may be employed as part of a chipset for executing one or more related functions in, for example, a computer.

Additionally, the embodiments described herein may be implemented further in one or more electronic devices. Non-limiting examples of electronic devices that may utilize the technologies described herein include any kind of mobile device and/or stationary device, such as microelectromechanical systems (MEMS) based electrical systems, gyroscopes, advanced driving assistance systems (ADAS), 5G communication systems, cameras, cell phones, computer terminals, desktop computers, electronic readers, facsimile machines, kiosks, netbook computers, notebook computers, internet devices, payment terminals, personal digital assistants, media players and/or recorders, servers (e.g., blade server, rack mount server, combinations thereof, etc.), set-top boxes, smart phones, tablet personal computers, ultra-mobile personal computers, wired telephones, combinations thereof, and the like. Such devices may be portable or stationary. In some embodiments, the technologies described herein may be employed in a desktop computer, laptop computer, smart phone, tablet computer, netbook computer, notebook computer, personal digital assistant, server, combinations thereof, and the like. More generally, the technologies described herein may be employed in any of a variety of electronic devices, including an electronic device with a high bandwidth memory package architecture/ process which stacks one or more next-generation high bandwidth low latency (HBLL) memory dies using redistribution layers (RDLs), through mold vias (TMVs), and/or passive silicon interposers (e.g., as shown below in FIGS. 1A-1B).

In the following description, various aspects of the illustrative implementations will be described using terms commonly employed by those skilled in the art to convey the substance of their work to others skilled in the art. However, it will be apparent to those skilled in the art that the present embodiments may be practiced with only some of the described aspects. For purposes of explanation, specific numbers, materials and configurations are set forth in order to provide a thorough understanding of the illustrative implementations. However, it will be apparent to one skilled in the art that the present embodiments may be practiced without the specific details. In other instances, well-known features are omitted or simplified in order not to obscure the illustrative implementations.

Various operations will be described as multiple discrete operations, in turn, in a manner that is most helpful in understanding the present embodiments, however, the order of description should not be construed to imply that these operations are necessarily order dependent. In particular, these operations need not be performed in the order of presentation.

One or more embodiments described herein are directed to structures and architectures for electronic packages that enable high capacity memory packages through memory die stacking and methods of forming such electronic packages. In particular, some of the embodiments described below provide architectures and processes that enable high bandwidth memory packages by stacking next generation high bandwidth low latency (HBLL) memory dies. For some embodiments, the memory packages described herein include one or more HBLL memory dies that may be stacked via (i) one or more RDLs and TMVs (e.g., as shown with the memory module 100 of FIG. 1A), and/or (ii) one or more RDLs and passive silicon interposers (e.g., as shown with the memory module 150 of FIG. 1B).

Some of the main advantages of the embodiments described herein are that both of these memory packages/ approaches may enable capacity doubling with the HBLL memory dies, and also enable direct HBLL memory coupling to a SoC package through a bridge die (e.g., an embedded multi-die interconnect bridge (EMIB)) or an on-die attach (e.g., an HBLL memory die having an I/O region). Other advantages of the HBLL memory package embodiments as described below include: (1) enabling the integration of high capacity memory with package substrates; (2) providing a path for a reduced SoC footprint and expandable memory capacity options; (3) increasing and offering flexibility for a high bandwidth memory with various memory capacities (e.g., >1 GB, memory capacity scaling for in a package memory); (4) eliminating the need to use high-cost HBM memory and thus significantly reducing product cost; (5) providing an opportunity to enable low-cost geographic supplier chains; and (6) eliminating the need of TSVs on memory dies.

Figure 1B:
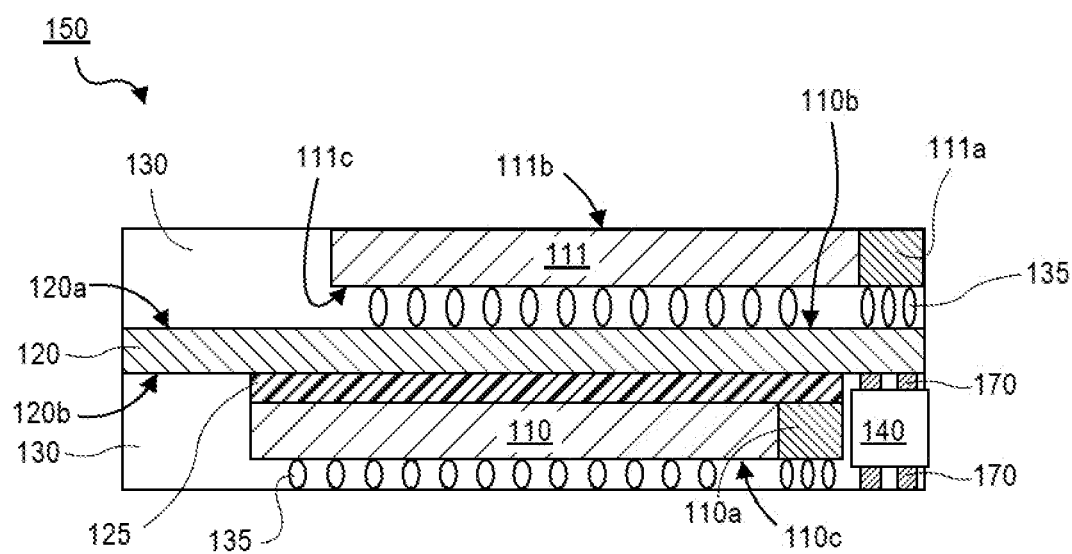
FIG. 1B is a cross-sectional illustration of a memory module with a passive interposer, in accordance with an embodiment.

Referring now to FIG. 1A, a cross-sectional illustration of a memory module 100 is shown in accordance with an embodiment. In an embodiment, the memory module 100 may comprise a plurality of memory dies. For example, the memory module 100 may comprise a first memory die 110 and a second memory die 111. The first memory die 110 may be encapsulated in a first mold layer 130 and the second die 111 may be encapsulated in a second mold layer 130. In an embodiment, a first surface 111b of the second die 111 may be substantially coplanar with a surface of the second mold layer 130. In other embodiments, the second mold layer 130 may be formed over the first surface 111b of the second die 111.

In an embodiment, the second die 111 may be electrically coupled to a first surface 120a of redistribution layer (RDL) 120. In an embodiment, the first surface 110b of the first die 110 may be attached to a second surface 120b of the RDL 120 with a die attach film (DAF) 125. The RDL 120 may provide routing from interconnects 135 on a second surface 111c of the second die 111 to through mold interconnects that pass through the first mold layer 130 that encapsulates the first memory die 110. For example, in FIG. 1A, the through mold interconnects may be through mold vias 160.

However, it is to be appreciated that embodiments may also include other through mold interconnects. For example, in FIG. 1B memory module 150 may include through mold interconnects that are implemented in a passive interposer 140. For example, the passive interposer 140 may be a silicon chip with through silicon vias (not show). Interconnects 170 may provide electrical connections from the passive interposer 140 to the surfaces of the mold layer 130. The use of a passive interposer 140 may allow for finer pitch of the interconnects compared to through mold vias 160. Accordingly, the form factor of the memory module 150 may be reduced compared to the form factor of memory module 100 in FIG. 1A.

Referring again to FIG. 1A, the memory dies 110 and 111 may be HBLL memory dies, where each of the HBLL memory dies includes an I/O region 110a and 111a. As shown, the I/O regions 110a and 111a may have interconnects 135 that have a different pitch than the interconnects 135 in the remaining portions of the memory dies 110 and 111, where these remaining portions may be referred to as the non-I/O regions of the memory dies 110 and 111 that include the power, ground, and test regions. For example, a first set of interconnects 135 may have a first pitch and a second set of interconnects 135 (i.e., the I/O interconnects 135 in the I/O regions 110a and 111a). In a particular embodiment, the first set of interconnects 135 in the non-I/O region of the memory dies 110 and 111 may have a minimum pitch of approximately 130 um, and the second set of interconnects 135 in the I/O regions 110a and 111a may have a pitch a minimum pitch of approximately 36 um to 55 um.

In an embodiment, the I/O regions 110a and 111a may be positioned proximate to edges of the respective memory dies 110 and 111. In an embodiment, the I/O region 111a may be positioned directly above the I/O region 110a. In other embodiments, the I/O region 111a may offset from the I/O region 110a. For an embodiment, the I/O regions 110a and 111a may be implemented as the edge-aligned die edge I/O ports of the respective first and second memory dies 110 and 111.

For some embodiments, the HBLL memory dies may utilize the I/O regions to shorten the interconnect length on the package side between, for example, the respective HBLL memory dies and the package substrate, the interposer, the SoC die, the base die, and any other memory package components—in order to reduce the resistance (R) and the capacitance (C) of such interconnects. Additionally, it is to be understood that each of the referenced memory dies may be a HBLL memory die, where the HBLL memory die as described herein offers an improved memory packaging solution to overcome the existing big latency gap between SRAM caches in the CPU and the external DRAM main memory.

As a key element for future computing systems, the HBLL memory dies described herein offer memory architectures, interfaces, and processes where the last level cache (LLC) may have a high random access bandwidth, a low random access latency, a density of 1 to 8 Gb, and all of signal I/O pads located on one side of the such dies (i.e., located on the I/O regions). In one embodiment, a memory die (e.g., the first/second memory die 110 and/or 111) may be a single-die 8-channel 4.5 Gb HBLL-RAM that is composed of 8 independent channels with a 576 Mb density. In such embodiments, each channel has 72 I/Os running at a double-data-rate (DDR) of 2.5 Gbps/pin, which provides a 180 Gb/s memory bandwidth and reinforces why the interconnect pitch of the I/O region is smaller and more compact. Thus, in these embodiments described herein, the total bandwidth of the 8 channels running in parallel may be approximately 180 GB/s, where each channel may provide 32 banks that are organized into 4 bank-groups, and where each bank-group may include 8 banks. Accordingly, during a read, each random access activates a row in one bank, then moves the selected data from the memory cells to the bank data buffer, and lastly the data then flows through the 2-stage bank-select multiplexer according to the preset latency timing (e.g., as shown with the vertical bank architecture 755 of FIG. 7H).

Figure 2A:
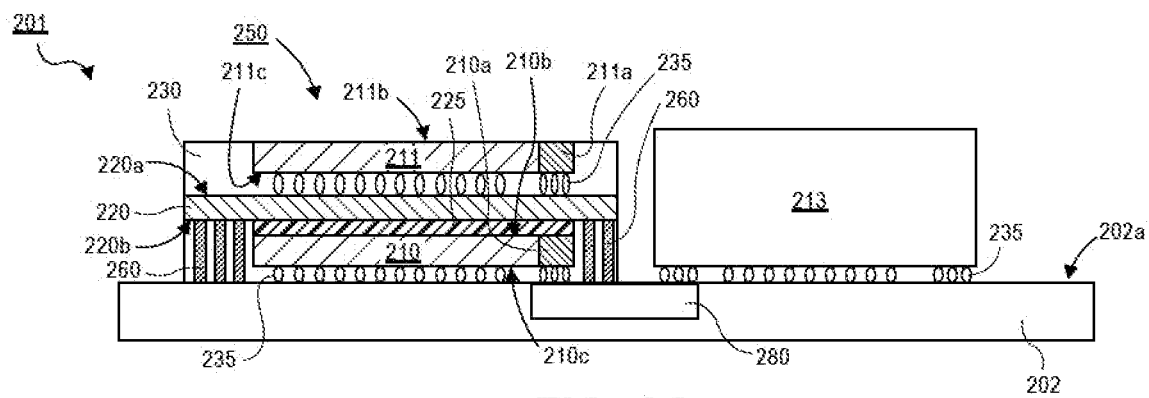
FIG. 2A is a cross-sectional illustration of an electronic package with a memory module with through mold vias electrically coupled to a system-on-chip (SoC) die by an embedded multi-die interconnect bridge (EMIB), in accordance with an embodiment.

Referring now to FIG. 2A, a cross-sectional illustration of an electronic package 201 is shown, in accordance with an embodiment. In an embodiment, the electronic package 201 may comprise a package substrate 202, a memory module 200, a system-on-chip (SoC) die 213 and an EMIB 280. In an embodiment, the memory module 200 may be substantially similar to the memory module 100 described above with respect to FIG. 1A. In an embodiment, the SoC die 213 may be a processor, a system on chip (SoC/SOC), or any other die including integrated circuitry. For other embodiments, the SoC die 213 may include, but is not limited to, a semiconductor die, a package (e.g., a carrier wafer package), an electronic device (e.g., a wireless device), an IC, a central processing unit (CPU), a microprocessor, a platform controller hub (PCH), a memory, and a field-programmable gate array (FPGA).

In an embodiment, the package substrate 202 may be any suitable package substrate, such as an organic package substrate with (or without) a core layer.

In an embodiment, the memory module 200 may be electrically coupled to the SoC die 213 by the EMIB 280. The EMIB 280 may be a silicon substrate or the like that includes conductive traces (not shown) for electrically coupling interconnects 235 and/or through mold vias 260 of the memory module 200 to interconnects 235 of the SoC die 213. Since the EMIB 280 is fabricated on a substrate with high dimensional stability, the routing in the EMIB 280 may include fine line/pitch in order to accommodate the reduced pitch of the I/O regions 210a and 211a of the memory module 200.

In an embodiment, the EMIB 280 may be embedded in the package substrate 202. That is one or more surfaces of the EMIB 280 may be in direct contact with portions of the package substrate 202. For example, a bottom surface and sidewall surfaces of the EMIB 280 may be covered by the package substrate 202. In an embodiment, the top surface of the EMIB 280 may be substantially coplanar with a top surface of the package substrate 202a.

Figure 2B:
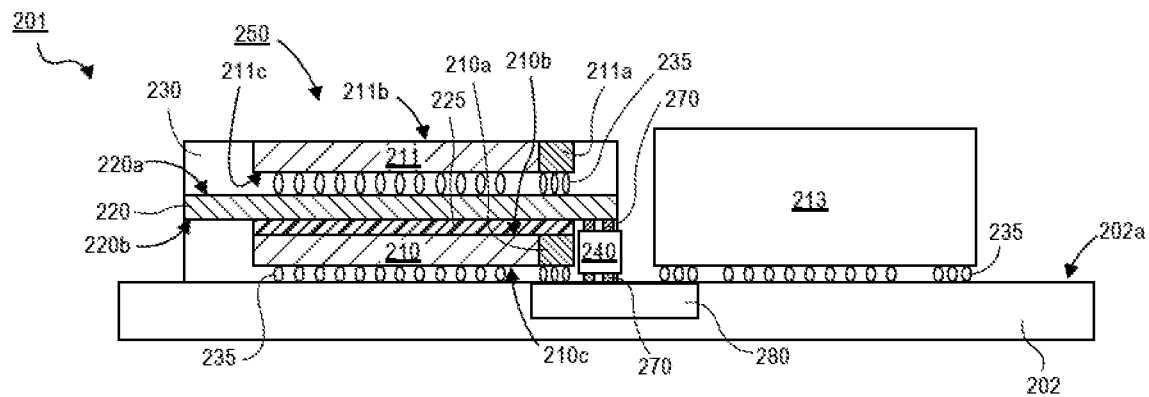
FIG. 2B is a cross-sectional illustration of an electronic package with a memory module with a passive interposer electrically coupled to a SoC die by an EMIB, in accordance with an embodiment.

Referring now to FIG. 2B, a cross-sectional illustration of an electronic package 201 is shown, in accordance with an additional embodiment. The electronic package 201 in FIG. 2B may be substantially similar to the electronic package 201 illustrated in FIG. 2A, with the exception that memory module 200 is replaced with memory module 250. That is, electronic package 201 may include a memory module 250 that includes a passive interposer 240 instead of through mold vias 260. In an embodiment, memory module 250 may be substantially similar to memory module 150 described above with respect to FIG. 1B.

Figure 3A:
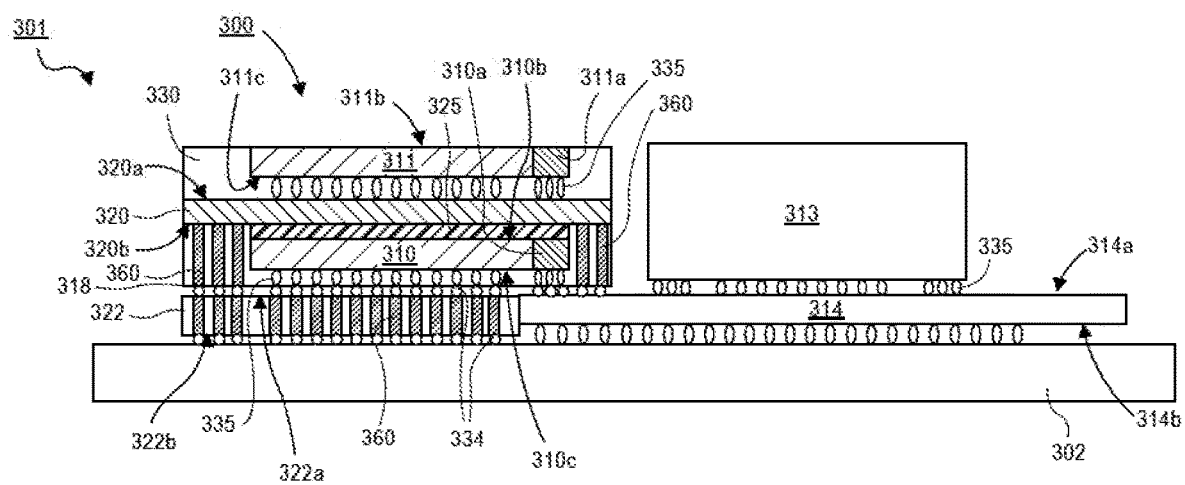
FIG. 3A is a cross-sectional illustration of an electronic package with a memory module with through mold vias electrically coupled to a SoC die by a base die, in accordance with an embodiment.

Referring now to FIG. 3A, a cross-sectional illustration of an electronic package 301 is shown, in accordance with an additional embodiment. In an embodiment, the electronic package 301 may comprise a package substrate 302, a memory module 300 with first and second memory dies 310-311, a base die 314, and a SoC die 313. In an embodiment, the SoC die 313 may be positioned above the base die 314. The SoC die 313 may be electrically coupled to a first surface 314a of the base die 314 with interconnects 335. Interconnects 335 may also couple a second surface 314b of the base die 314 to the package substrate 302. In an embodiment, the base die 314 may also electrically couple the memory module 300 to the SoC die 313. The base die 314 may be any suitable die, including memory dies, processor dies, or a passive interposer. In an embodiment, the base die 314 may include electrical routing with a fine line/pitch configuration in order to accommodate the small pitch of the I/O regions 310a and 311a of the memory module 300.

Since the base die 314 is above the package substrate 302, a portion of the memory module 300 may be spaced above the package substrate 302 as well. Accordingly, embodiments may include a passive interposer 322 that provides electrical connections (e.g., vias 360) from the memory module 300 to the package substrate 302. Additionally, the passive interposer 322 may enable coupling the intermediate and bottom molded components in the stack, such as the package substrate 302 and the intermediate molded stack with the first memory die 310.

Figure 3B:
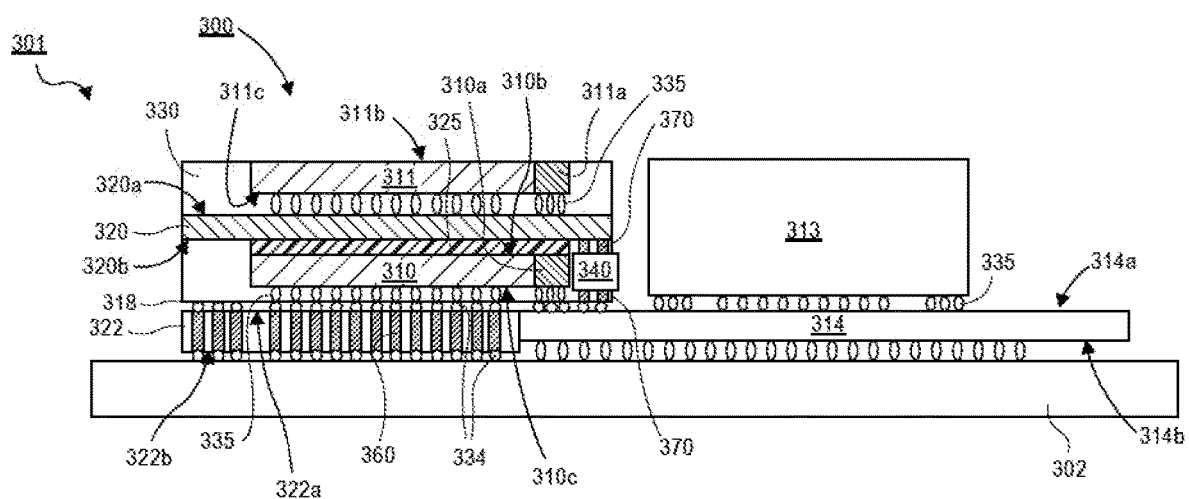
FIG. 3B is a cross-sectional illustration of an electronic package with a memory module with a passive interposer electrically coupled to a SoC die by a base die, in accordance with an embodiment.
Figure 3C:
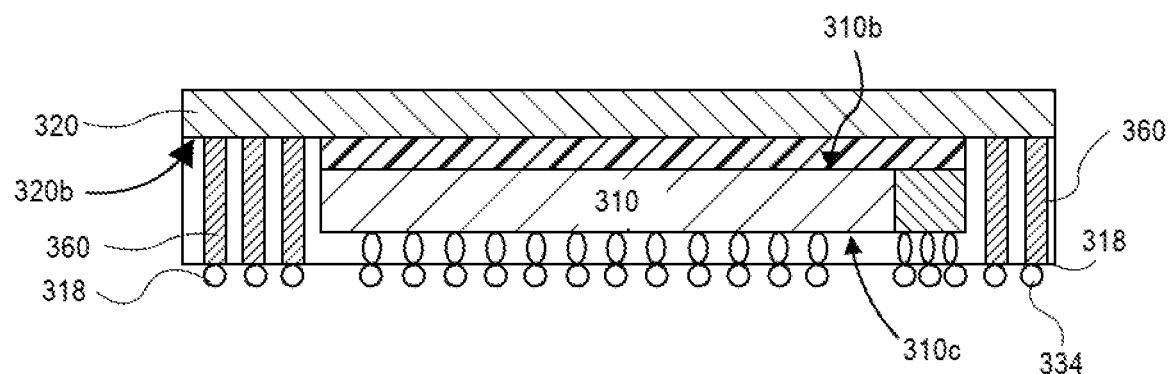
FIG. 3C is a cross-sectional illustration of a portion of the memory module, in accordance with an embodiment.

In some embodiments, as shown in FIG. 3C, the FLI 335 under the first memory die 310 may be formed as Cu pillars for the tight-pitch die interconnects needed for the first memory die 310 (without solder caps). This embodiment may also require that the package use a grinding operation to equally expose the bottom ends of the Cu posts or Cu vias 360 (i.e., tall vias on the perimeter) and the FLI 335.

Figure 3D:
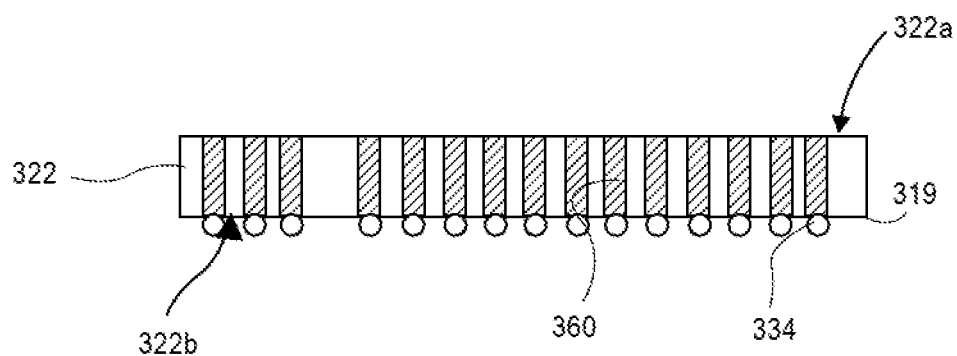
FIG. 3D is a cross-sectional illustration of an interposer, in accordance with an embodiment.

In some embodiments, as shown in FIG. 3D, the interposer 322 may be used to extend the copper pillar/TMV region of the vias 360 for increased height. Additionally, the interposer 322 may be disposed in between and coupled to the first memory die 310 and the package substrate 302 by grinding across the top and bottom of the molded package to expose both ends of the copper for each via 360, and then attaching the micro-balls 334 to the bottom of each via 360.

In one embodiment, the interposer 322 may need a microball drop attach on the bottoms of each of the cu posts vias 360 and the first-level interconnects (FLI) joint interconnects 335.

In an embodiment, interconnects 334 may be formed on the first surface 322a and the second surface 322b of the passive interposer 322. For some embodiments, the interconnects 335 disposed below the first memory die 310 may be coupled to the interconnects 334 by grinding across the molded package to expose the copper for each interconnect 335, and then attaching the micro-balls 334 to each interconnect 335.

Referring now to FIG. 3B, a cross-sectional illustration of an electronic package 301 is shown, in accordance with an additional embodiment. The electronic package 301 in FIG. 3B may be substantially similar to the electronic package 301 illustrated in FIG. 3A, with the exception that memory module 300 is replaced with memory module 350. That is, electronic package 301 may include a memory module 350 that includes a passive interposer 340 instead of through mold vias 360. In an embodiment, memory module 350 may be substantially similar to memory module 150 described above with respect to FIG. 1B.

Referring now to FIGS. 4A-4I, a process flow for assembling a memory module 400 is shown, in accordance with an embodiment. In an embodiment, the memory module 400 assembled in FIGS. 4A-4I may be substantially similar to the memory module 100 described above with respect to FIG. 1A. In addition, the FIGS. 4A-4I may implement memory die stacking that may be achieved through RDLs and TMVs (e.g., as shown in the memory module 100 of FIG. 1A) or through passive silicon interposers (e.g., as shown in the memory module 150 of FIG. 1B). Accordingly, FIGS. 4A-4I shows the process flow used for stacking a memory die 410 with a fan-out process via an RDL 420 and Cu TMVs 460. Alternatively, the memory die stack can be achieved through passive silicon interposers using the process flow shown in FIGS. 5A-5E.

Figure 4A:
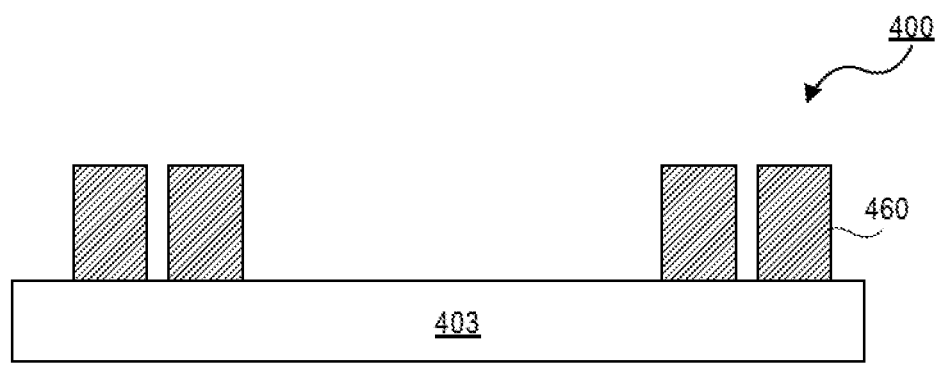
FIGS. 4A-4I are cross-sectional illustrations depicting a process for assembling a memory module, in accordance with an embodiment.

Referring now to FIG. 4A, a cross-sectional illustration of a substrate 403 is shown, in accordance with an embodiment. In an embodiment, the substrate 403 may be a carrier substrate. That is, the substrate 403 may be used for the assembly of the memory module and subsequently removed. In an embodiment, a plurality of conductive pillars 460 are formed over the substrate 403.

Figure 4B:
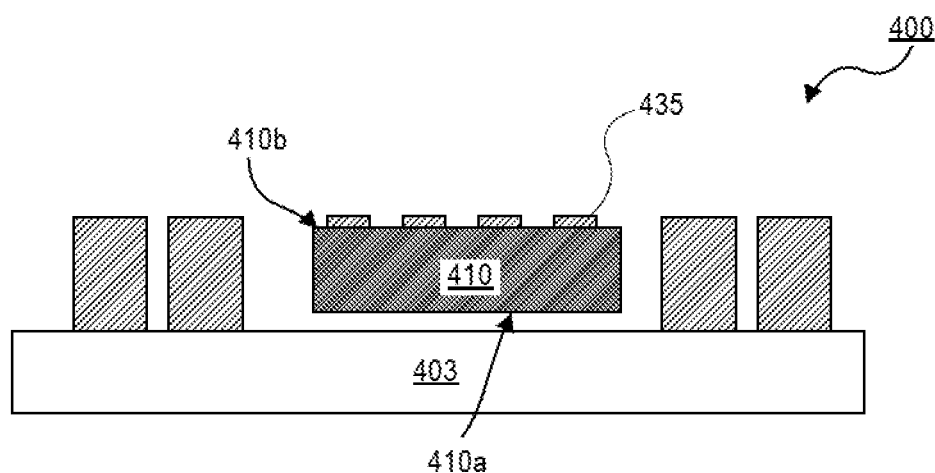

Referring now to FIG. 4B, a cross-sectional illustration as the first memory die 410 is placed on the substrate 403 is shown, in accordance with an embodiment. In an embodiment, the memory die 410 may be placed on the substrate 403 with a pick and place tool or the like. In an embodiment, a first surface 410a of the memory die 410 may rest on the substrate 403. A second surface 410b may be opposite from the first surface 410a. In an embodiment, interconnects 435 may be formed on the second surface 410b of the memory die 410. While shown as having a substantially uniform pitch, it is to be appreciated that embodiments may include interconnects with a first pitch and a second pitch. For example, the second pitch may be smaller than the first pitch. The interconnects 435 that are the second pitch may be used for the I/O region (similar to what is described above with respect to FIG. 1A).

Figure 4C:
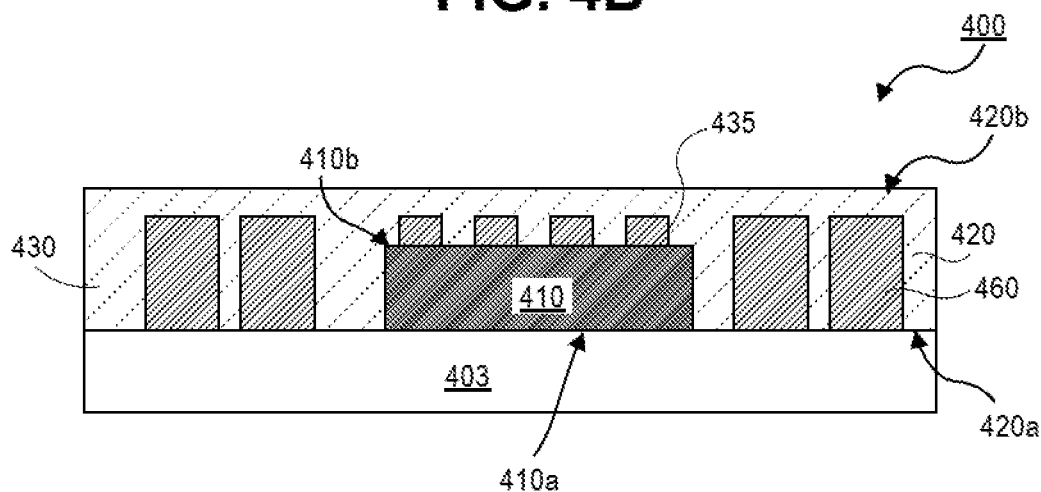

Referring now to FIG. 4C, a cross-sectional illustration after a mold layer 430 is formed over the substrate 403 is shown, in accordance with an embodiment. In an embodiment, the mold layer 430 may encapsulate the memory die 410. The mold layer may also encapsulate the conductive pillars 460.

Figure 4D:
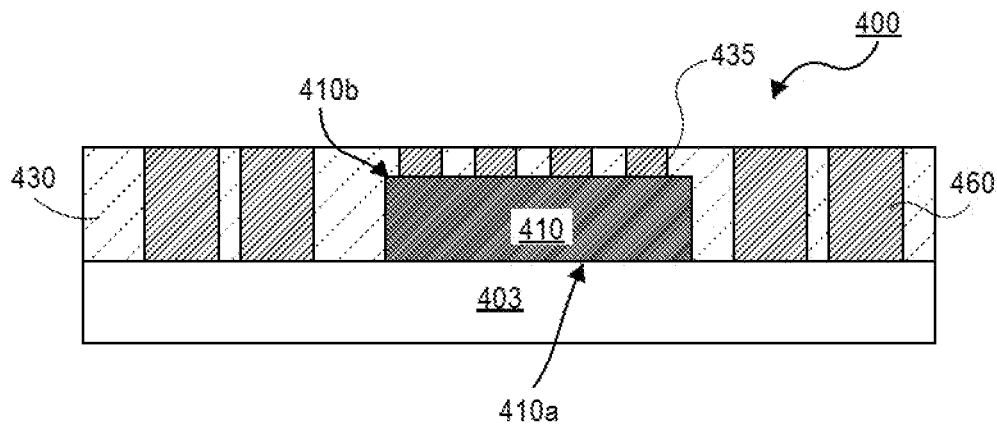
Figure 4E:
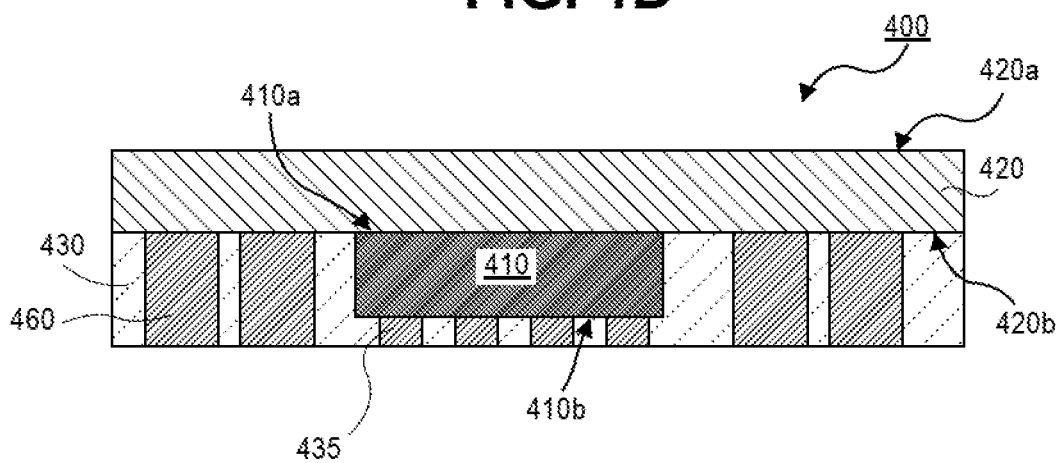

Referring now to FIG. 4D, a cross-sectional illustration after the mold layer 430 is planarized is shown, in accordance with an embodiment. In an embodiment, the mold layer may be planarized with top surfaces of the conductive pillars 460 and top surfaces of the interconnects 435. Referring now to FIG. 4E, a cross-sectional illustration after a redistribution layer (RDL) 420 is formed over the mold layer 430 is shown, in accordance with an embodiment. In an embodiment, the RDL 420 may comprise a conductive traces and vias (not shown) for routing electrical signals from a second memory die (added in a subsequent operation) to the conductive pillars 460. In an embodiment, the substrate 403 may be removed.

Figure 4F:
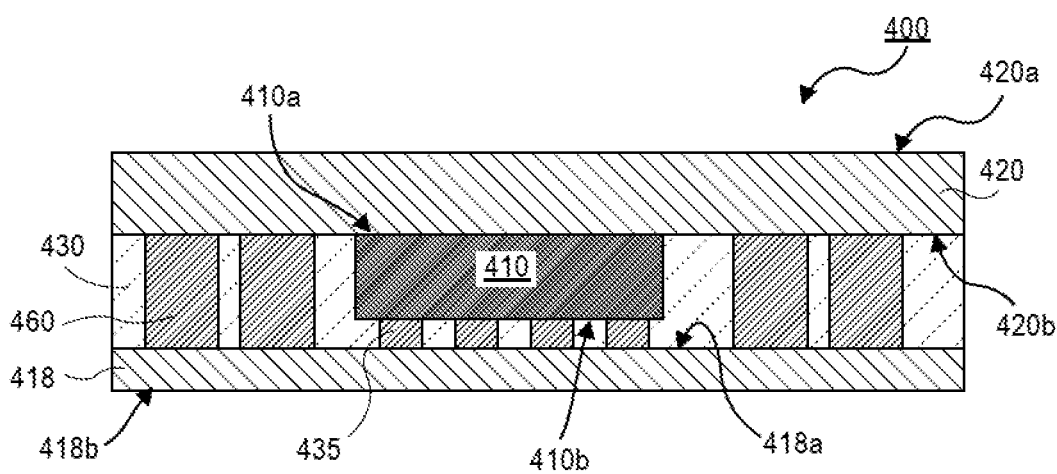

Referring now to FIG. 4F, a cross-sectional illustration after a second RDL 418 is formed is shown, in accordance with an embodiment. In an embodiment, the second RDL 418 may provide routing for the bump side of the memory module. In some embodiments, the second RDL 418 may be omitted if additional routing is not needed. In an embodiment, the RDL 418 may include a first surface 418a that contacts the mold layer 430 and a second surface 418b that is opposite form the first surface 418a.

Figure 4G:
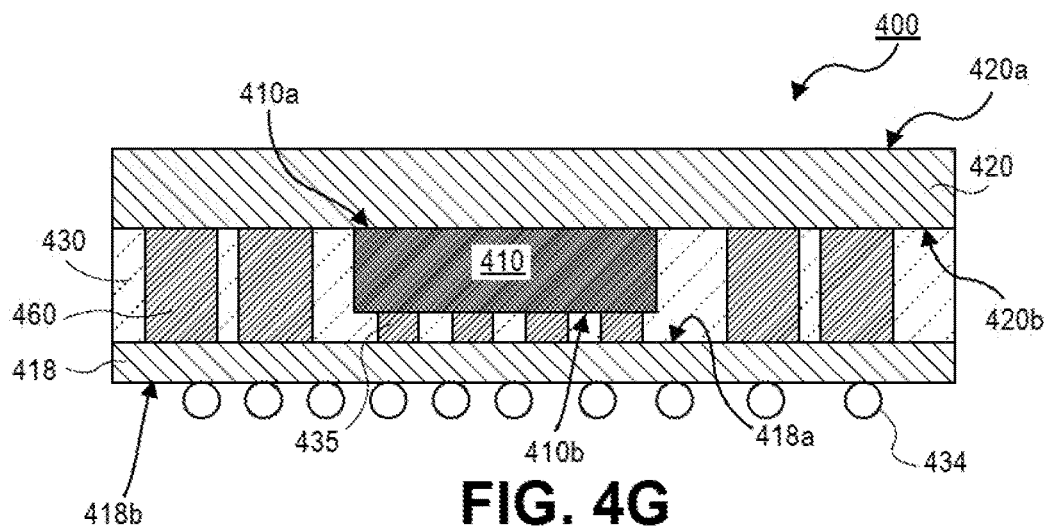
Figure 4H:
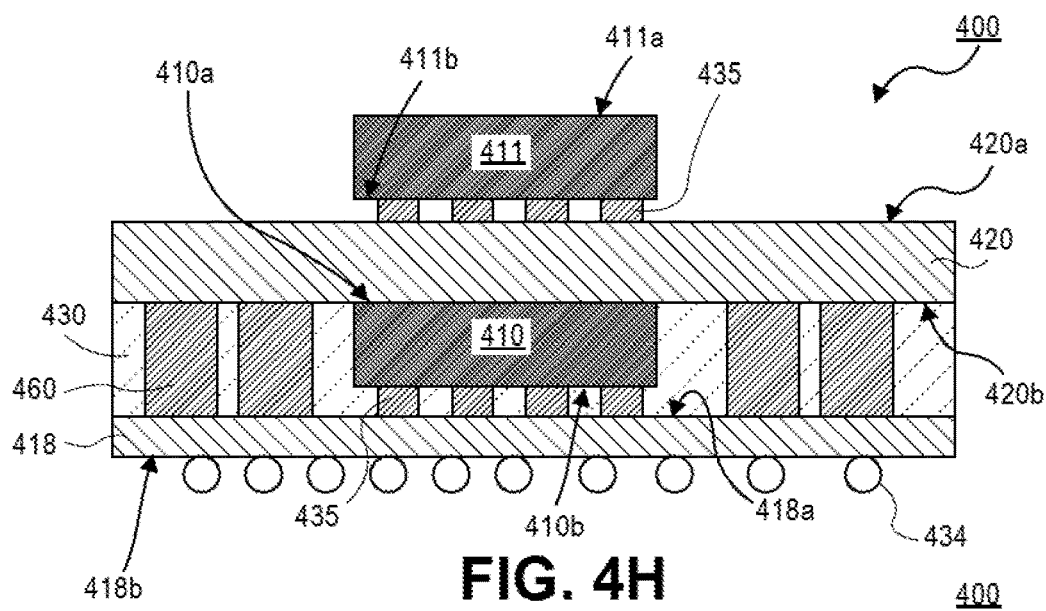

Referring now to FIG. 4G, a cross-sectional illustration after bumps 434 are attached to the second RDL 418 is shown, in accordance with an embodiment. The bumps 434 may be solder bumps or the like. Referring now to FIG. 4H, a cross-sectional illustration after a second memory die 411 is attached to the first surface 420a of the RDL 420 is shown, in accordance with an embodiment. In an embodiment, the second surface 411b of the second memory die 411 may be coupled to the RDL 420 with interconnects 435. In the illustrated embodiment, the interconnects 435 are shown with a uniform pitch. However, it is to be appreciated that embodiments may also include interconnects with a first pitch and second pitch that is smaller than the first pitch. For example the second pitch may accommodate an I/O region similar to I/O region 111a in FIG. 1A.

Figure 4I:
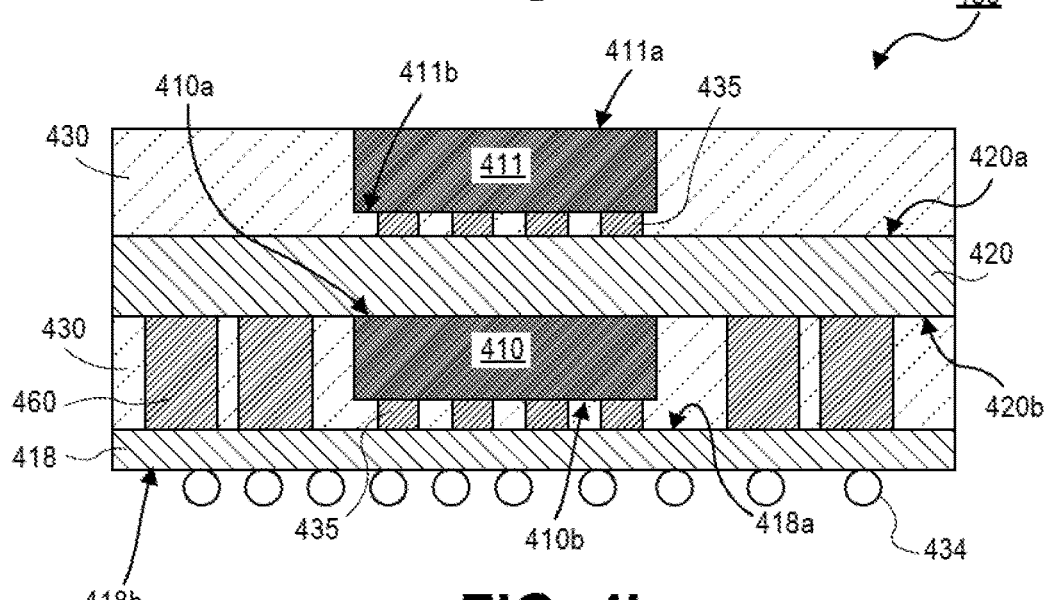

Referring now to FIG. 4I, a cross-sectional illustration after a second mold layer 430 is deposited over the RDL 420 and the second memory die 411 is shown, in accordance with an embodiment. In an embodiment, the mold layer 430 may have a surface that is planarized with a first surface 411a of the second memory die 411.

Referring now to FIGS. 5A-5E a series of cross-sectional illustrations depict a process flow for assembling a memory module 550 is shown, in accordance with an embodiment. In an embodiment, memory module 550 may be substantially similar to memory module 150 described above with respect to FIG. 1B.

Figure 5A:
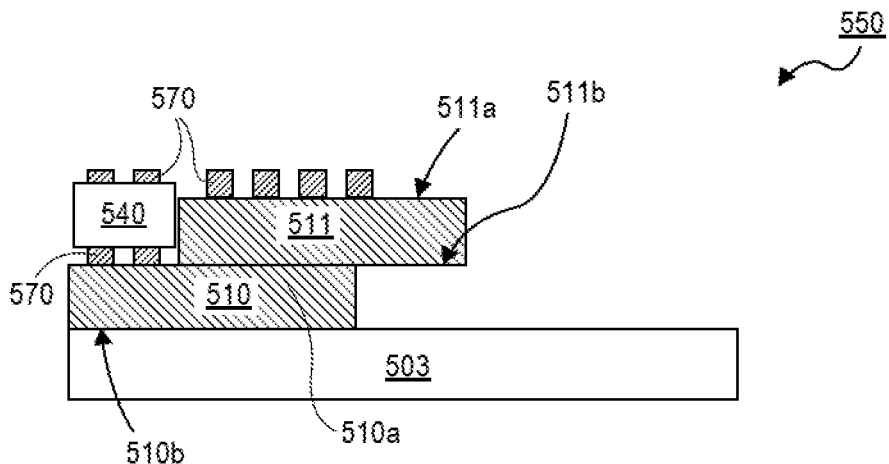
FIGS. 5A-5E are cross-sectional illustrations depicting a process for assembling a memory module, in accordance with an additional embodiment.

Referring now to FIG. 5A, a cross-sectional illustration of a first memory die 510 and a second memory die 511 on a carrier substrate 503 is shown, in accordance with an embodiment. In an embodiment, the first memory die 510 may have a second surface 510b that is supported by the substrate 503. In an embodiment, a second surface of the second memory die 511 may rest on the first surface 510a of the first die 510. In an embodiment, interconnects 570 may be formed on the first surfaces 510a and 511 of the memory dies 510 and 511. In an embodiment, a passive interposer 540 may be attached to the first die 510 by interconnects 570. In an embodiment, the passive interposer 540 may provide electrical routing for an I/O region (not shown) of the first memory die 510.

Figure 5B:
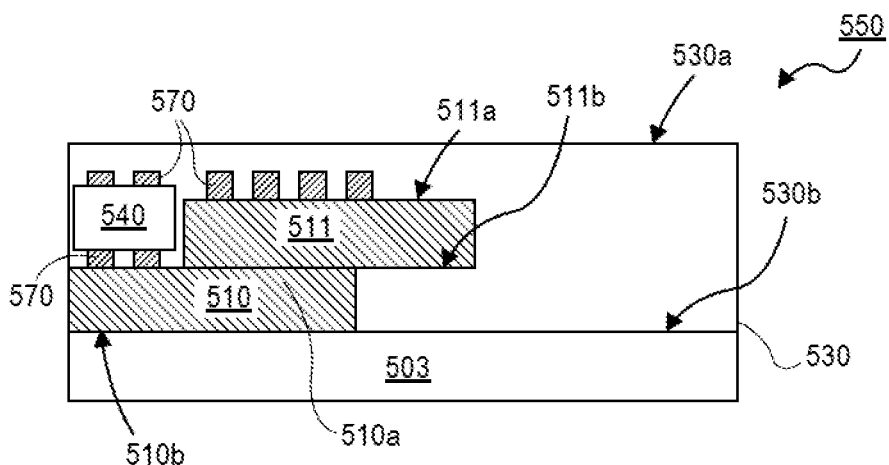

Referring now to FIG. 5B, a cross-sectional illustration after a mold layer 530 is disposed over the substrate 503 and the memory dies 510 and 511. In an embodiment, the mold layer 530 may comprise a second surface 530b that is over the substrate 503 and a first surface 530a that is opposite from the second surface. The mold layer 530 may fully encapsulate the first memory die 510 and the second memory die 511.

Figure 5C:
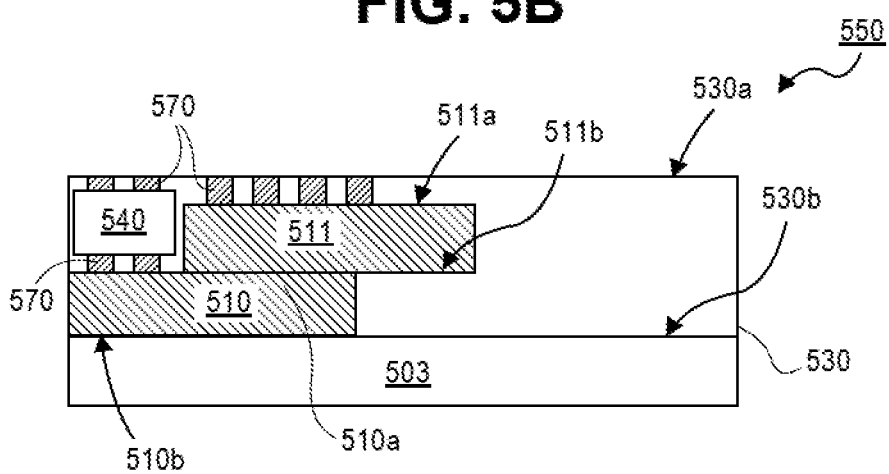
Figure 5D:
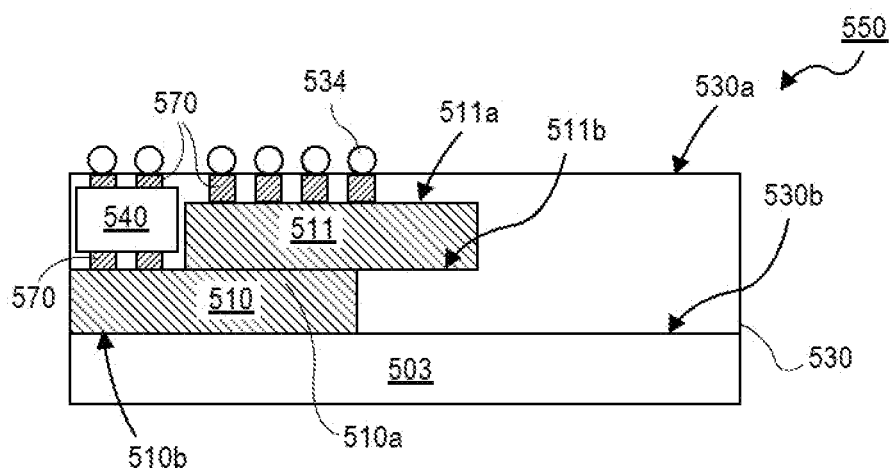
Figure 5E:
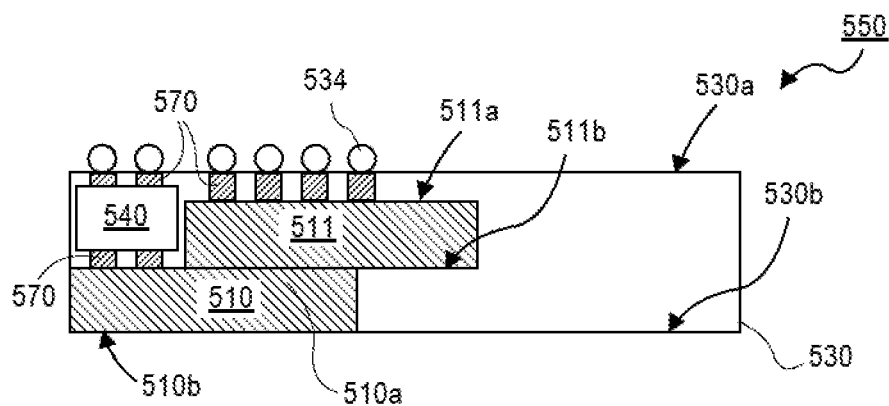

Referring now to FIG. 5C, a cross-sectional illustration after the mold layer is planarized with top surfaces of the interconnects 570 is shown, in accordance with an embodiment. Referring now to FIG. 5D, a cross-sectional illustration after bumps 534 are disposed over the interconnects 570 is shown, in accordance with an embodiment. Referring now to FIG. 5E, a cross-sectional illustration after the carrier substrate 503 is removed is shown, in accordance with an embodiment.

Figure 6A:
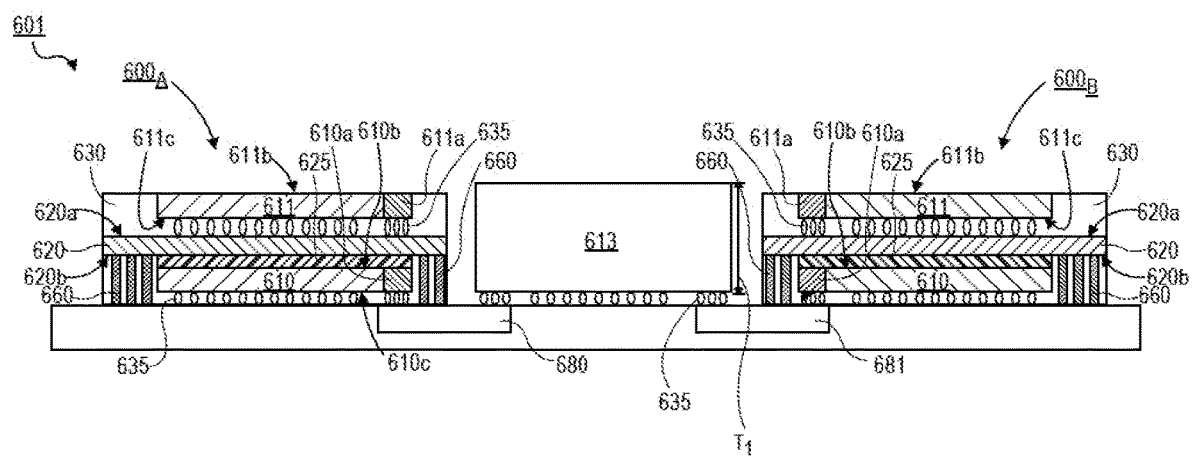
FIG. 6A is a cross-sectional illustration of an electronic package with a plurality of memory modules electrically coupled to the SoC die by EMIBs, in accordance with an embodiment.
Figure 6B:
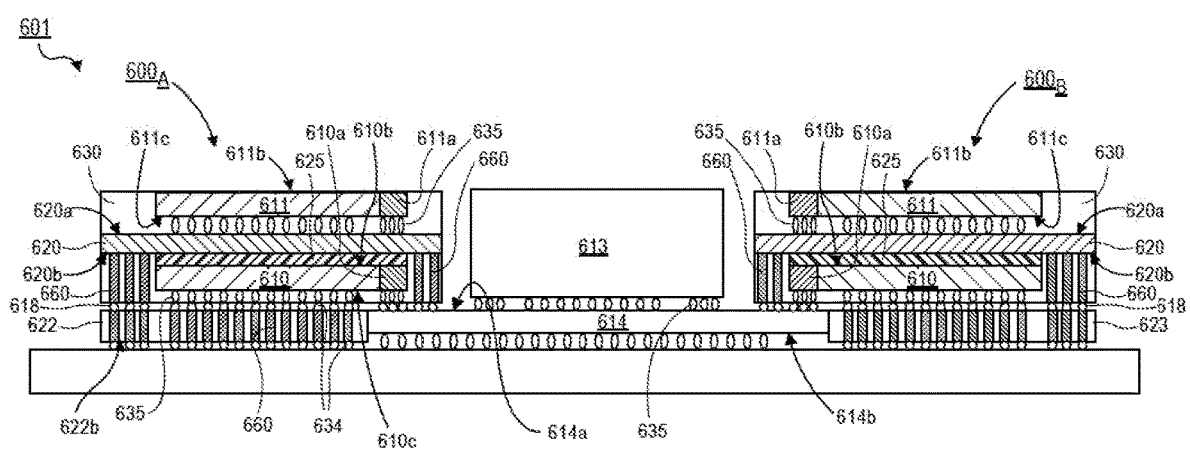
FIG. 6B is a cross-sectional illustration of an electronic package with a plurality of memory modules electrically coupled to the SoC die by a base die, in accordance with an embodiment.

In FIG. 6A-6B, a cross-sectional illustration of high capacity memory packages 601 is shown, where such packages 601 integrate one or more dies 610-614 using a memory die stacking process as described herein. Additionally, another advantage of the stacked memory package architecture 601 as illustrated in FIGS. 6A-6B is to enable further scaling of the memory capacity. If the high bandwidth memory capacity requirement is higher than 2 Gb, the stacked memory package 601 can be attached on both sides of the SoC dies 613 through the EMIB 680 or base die 614 to extend the application, as described below in FIGS. 6A-6B.

Referring now to FIG. 6A, a cross-sectional illustration of an electronic package 601 with a plurality of memory modules 600 is shown, in accordance with an embodiment. The electronic package 601 may be substantially similar to the electronic package 201 illustrated in FIG. 2A, with the exception that an additional memory module 600 is added to the package.

Particularly, electronic package 601 may include a first memory module 600A and a second memory module 600B. Each of the memory modules may be substantially similar to memory modules 100 described above with respect to FIG. 1A. As shown in FIG. 6A, the first memory module 600A may be electrically coupled to the SoC die 613 with a first EMIB 680 and the second memory module 600B may be electrically coupled to the SoC die 613 by a second EMIB 681. Note that the SoC die 613 may have a thickness $T_1$, where the top surface of the SoC die 613 may have a z-height that is approximately equal to (or slightly greater than) the z-heights of the top surfaces 611b of the memory dies 61 on both the first and second memory modules 600A and 600B.

Referring now to FIG. 6B, a cross-sectional illustration of an electronic package 601 is shown, in accordance with an additional embodiment. The electronic package 601 may be substantially similar to the electronic package 301 illustrated in FIG. 3A, with the exception that an additional memory module 600 is added to the package. Particularly, electronic package 601 may include a first memory module 600A and a second memory module 600B. Each of the memory modules may be substantially similar to memory modules 100 described above with respect to FIG. 1A. As shown in FIG. 6B, the first memory module 600A and the second memory module 600B may be electrically coupled to the SoC die 613 by a base die 614.

FIGS. 7A-7K illustrate one or more embodiments of low capacity, high bandwidth single die DRAM memory, architecture, ball-out interface and organic package integration. As shown below in FIGS. 7A-7B, the electronic packages 700 and 750 include the HBLL 710-711, the mold layers 730, the package substrates 702, the SoC dies 713, the base die 714, the EMIBs 780-781, the I/O regions 710a and 711a with the interconnects 735b, and the interconnects 735. In particular, as described below, the FIGS. 7C-7K illustrate one or more embodiments of the processes, architectures, u-bump arrangements, ball-out interfaces, and schematics that are implemented to form the HBLL dies 710-711 (also including any of the other memory dies described above in FIGS. 1-6). For example, FIGS. 7C-7K illustrate the vertical/horizontal architectures and schematics of the HBLL memory dies, the ball-out interface, and the u-bump arrangements, according to some embodiments.

Figure 7A:
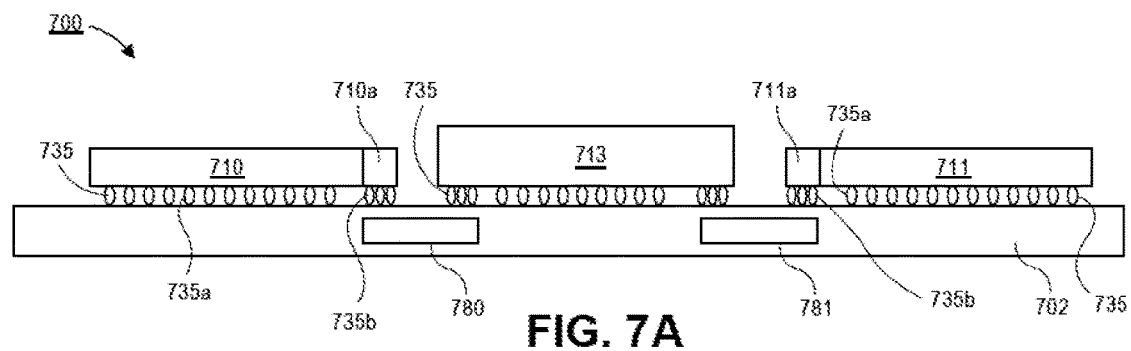
FIG. 7A is a cross-sectional illustration of an electronic package with a plurality of memory dies electrically coupled to a SoC die by EMIBs, in accordance with an embodiment.
Figure 7B:
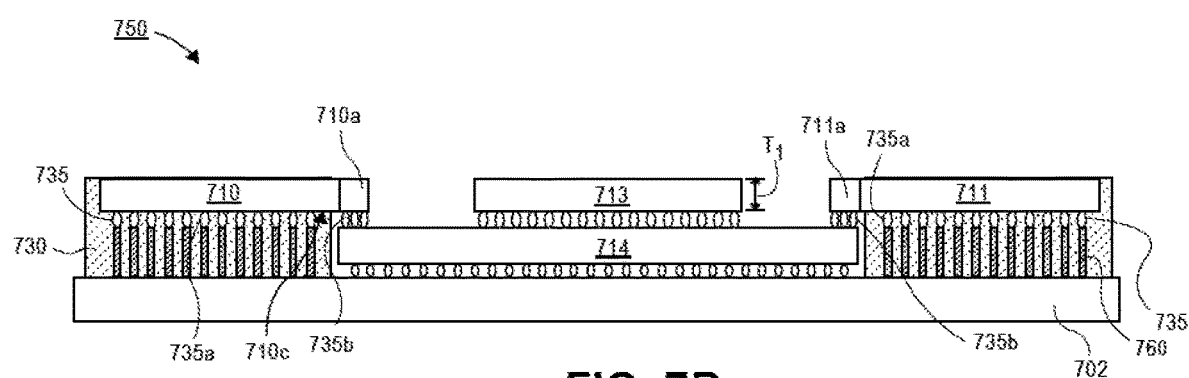
FIG. 7B is a cross-sectional illustration of an electronic package with a plurality of memory dies electrically coupled to a SoC die by a base die, in accordance with an embodiment.

In one embodiment, the electronic package 700 may integrate the memory dies 710-711 with the package substrate 702 using the EMIBs 780 to electrically couple the memory dies 710-711 to the package substrate 702, as shown in FIG. 7A. Alternatively, in another embodiment, the electronic package 750 may integrate the memory dies 710-711 with the package substrate 702 using a base die 714, which may electrically couple the respective I/O regions 710a and 711a of the memory dies 710-711 to the package substrate 702, as shown in FIG. 7B. In these alternative embodiment illustrated in FIG. 7B, the memory dies 710-711 may be coupled onto of the base die 714 by implementing one or more specific memory ball-out patterns as shown, for example, in FIGS. 7D-7E.

Accordingly, as described herein, the first and second memory dies 710-711 may combine one or more vertical DRAM die architectures and horizontal DRAM die architectures to improve the low capacity, high bandwidth needs. In particular, the electronic package 700 of FIGS. 7A-7B illustrates the first and second memory dies 710-711 having both vertical and horizontal bank architectures (as shown in FIGS. 7C-7K). These combined architectures used to form the HBLL dies 710-711 may be implemented by (i) increasing the bank number with a minimum area overhead, (ii) enabling a path over the memory array in order to increase the effective page usage, and (iii) thereby increasing the prefetch size (as compared to existing technologies that generally have a smaller page size).

Referring now to FIG. 7A, a cross-sectional illustration of an electronic package 700 is shown, in accordance with an additional embodiment. In an embodiment, the electronic package 700 may also be referred to as a DRAM memory package that includes a first memory die 710 and a second memory die 711. In an embodiment, each of the first memory die 710 and the second memory die 711 may include an I/O region 710a and 711a, respectively. In an embodiment, memory dies 710 and 711 may have first interconnects 735a with a first pitch, and the I/O regions 710a and 711a that have interconnects 735b with a second pitch, where the first pitches of the first interconnects 735a may have a minimum pitch size of approximately 130 um for the power, ground, and test regions, and the second pitches of the second interconnects 735b may have a minimum pitch size of approximately 55 um for input and output regions. In an embodiment, the second pitch may be smaller than the first pitch. In an embodiment, the interconnects 735b may be electrically coupled to the SoC die 731 by EMIBs 780 and 781 that are embedded in the package substrate 702.

Referring now to FIG. 7B, a cross-sectional illustration of an electronic package 750 is shown, in accordance with an embodiment. In an embodiment, electronic package 750 may be substantially similar to electronic package 700 with the exception that the EMIBs 780 and 781 are replaced with a base die 714. In an embodiment, the I/O region interconnects 735b may be directly connected to the base die 714. In an embodiment, the first interconnects 735a may be electrically coupled to the package substrate 702 with vertical vias 780. In an embodiment, a mold layer 730 may encapsulate the vertical vias 780. For some embodiments, the memory dies 710 and 711 may have the first pitches of the first interconnects 735a formed with a minimum pitch size of approximately 130 um for the power, ground, and test regions, and the second pitches of the second interconnects 735b formed with a minimum pitch size of approximately 55 um for input and output regions. Also note that the SoC die 713 may have a thickness $T_1$, where the top surface of the SoC die 713 may have a z-height that is approximately equal to the z-heights of the top surfaces of the memory dies 710 and 711.

Figure 7C:
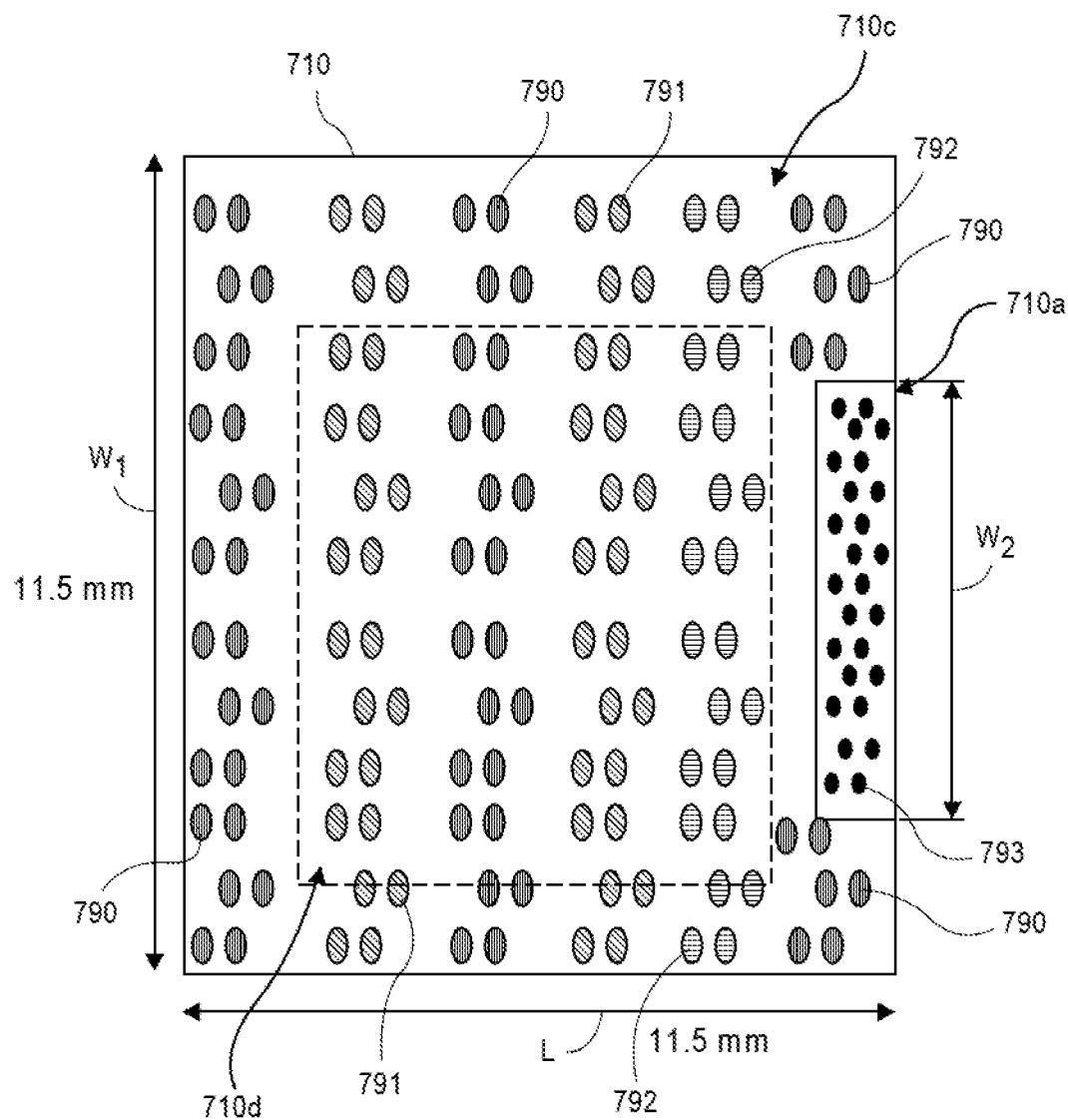
FIG. 7C is a plan view of a bottom surface of a memory die having a ball-out pattern, in accordance with an embodiment.

Referring now to FIG. 7C, a plan view of a bottom surface 710c of the memory die 710 (or the HBLL memory die) having a specified ball-out pattern is shown, in accordance with an embodiment. In one embodiment, the memory die 710 may be designed with such ball-out pattern, which allows the memory die 710 to be backward compatible with the JEDEC standard of the HBM for the I/O signaling portion of the I/O region 710a. Exact ball-out pattern, pitch and other details may be selected based on the desired final design of the package and architecture.

In this embodiment, the memory die 710 may have a bottom surface 710c that has a footprint ($W_1 \times L$) of approximately 11.5 mm$^2$ or less. For one alternative embodiment, the ball-out pattern may include a smaller region 710d that may have one or more different bumps. The ball-out pattern may include a plurality of power supply bumps 790, a plurality of ground bumps 791, and a plurality of power supply bumps 792 of the I/O region 710a. Note that the bottom surface 710c of the memory die 710 may include any desired bump pattern and bump locations. In some embodiments, the plurality of bumps 790-792 may have a minimum pitch size of roughly 130 um or larger.

As described above, the ball-out pattern of the memory die 710 may have the I/O region 710a formed on one of the edges of the bottom surface 710c, where the region 710a may have a maximum $W_2$ of approximately in 6 mm and a minimum pitch of roughly 36 um to 55 um (or roughly 36 um or less). Note that, this ball-out pattern depicts the respective bumps 790-792 as being formed roughly in parallel to each other, but as described above, the ball-out pattern may have formed to have any shape and/or arrangement no based on the application or design.

Figures 7D, 7E:
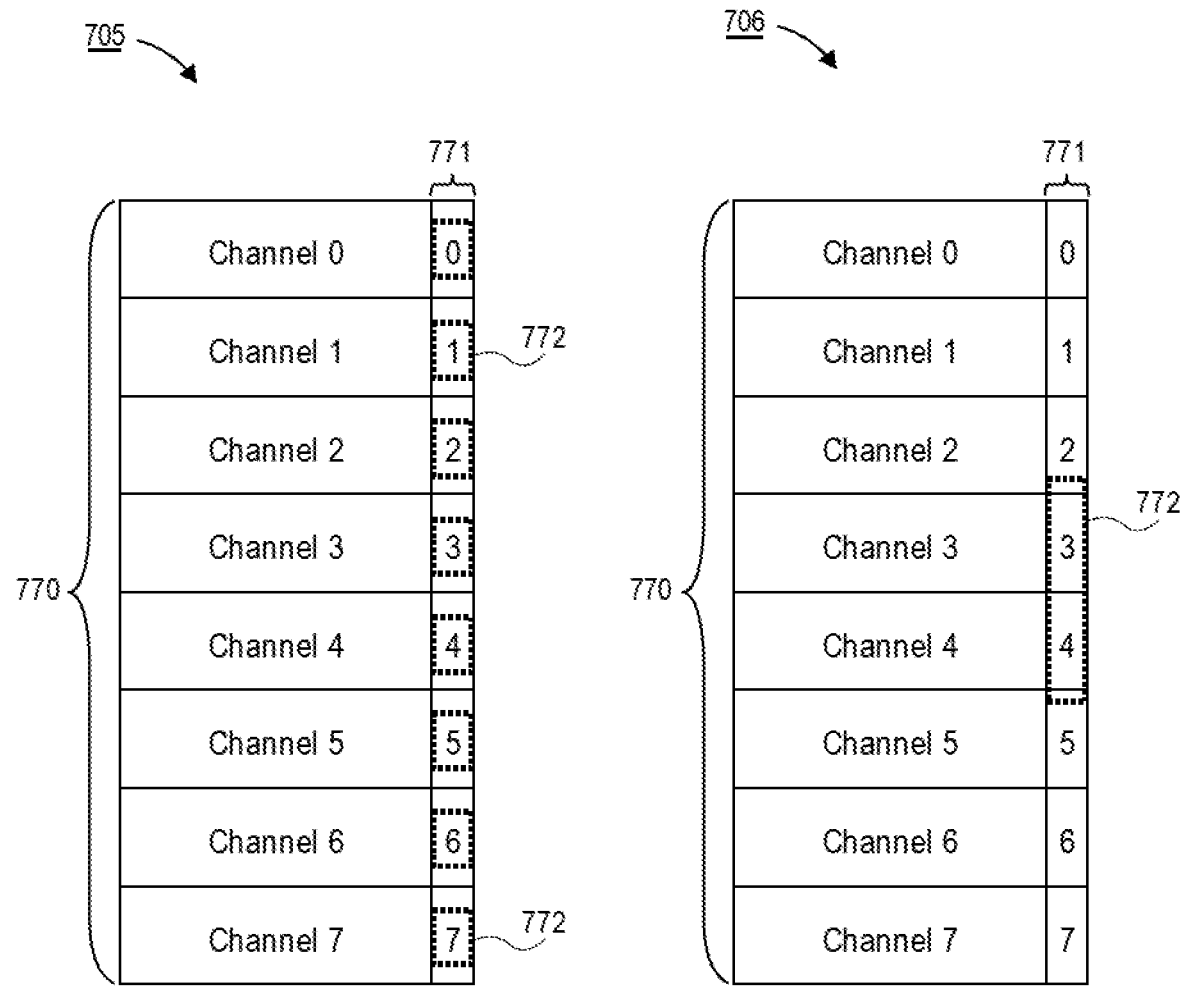
FIG. 7D is a block diagram illustration of a first edge-aligned die edge input/output (I/O) port on a memory die, in accordance with an embodiment.
FIG. 7E is a block diagram illustration of a second edge-aligned die edge I/O port on a memory die, in accordance with an embodiment.

Referring now to FIG. 7D, a block diagram illustration of a distributed u-bump arrangement 705 is shown. In addition, referring now to FIG. 7E, a block diagram illustration of a centered u-bump arrangement 706 is shown. As shown in FIGS. 7D-7E, the u-bump arrangements 705-706 may depict one or more channel arrangements 770, I/O ports 771, and u-bump placements 772 in the I/O port 771 region, in accordance with some embodiments.

In one embodiment, the distributed u-bump arrangement 705 shown in FIG. 7D may have a general signal connection, where the SoC/Memory Controller (MC) side may need to adjust its respective ports to match the distributed u-bump placements/locations 772 in the die I/O port region 771. In another embodiment, the centered u-Bump arrangement 706 shown in FIG. 7E may also offer a straight connection to the SoC/MC side, but as stated above, the routing adjustments inside the memory die I/O port region 771 may be needed. Note that, in other embodiments, the memory die may select a u-bump arrangement based on the memory timings, performance and design feasibilities for signal integrity.

Figure 7F:
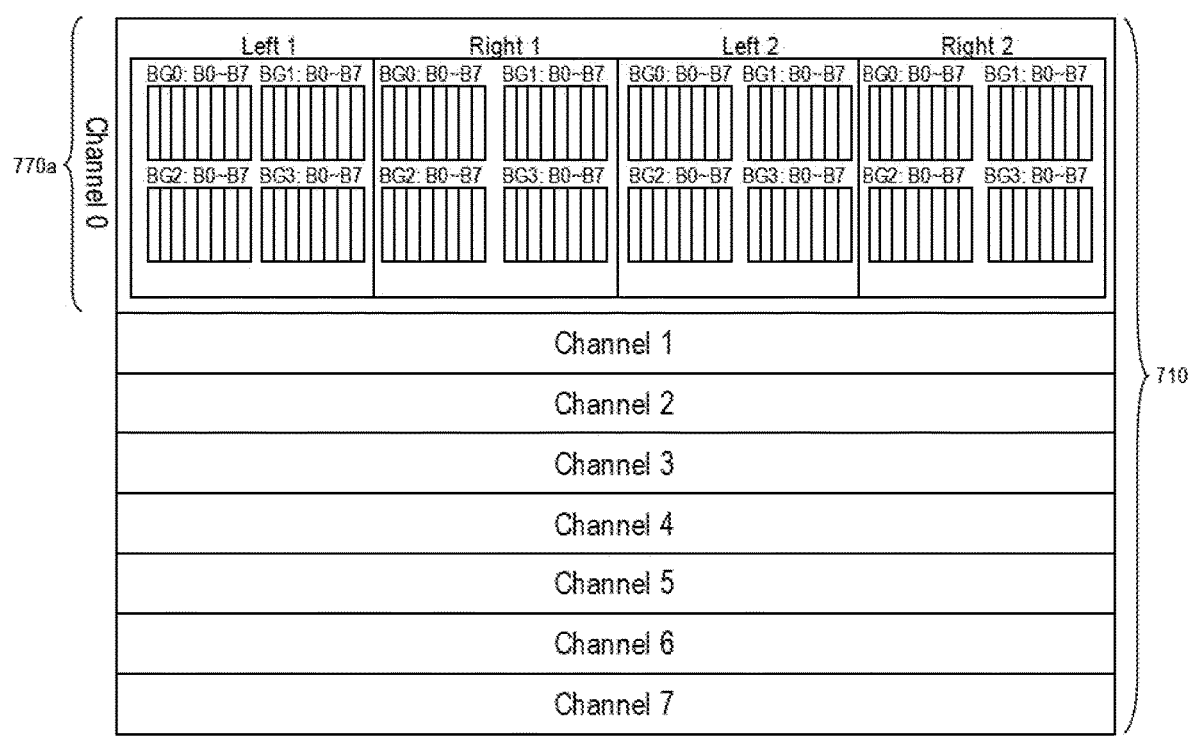
FIG. 7F is a block diagram illustration of a detailed I/O port on a memory die, in accordance with an embodiment.

FIG. 7F illustrates a detailed block diagram of a total architecture view of the memory die 710, in accordance with an embodiment. For example, FIG. 7F illustrates a detailed pin allocation of a first channel layer 770a ("Channel 0").

Figure 7G:
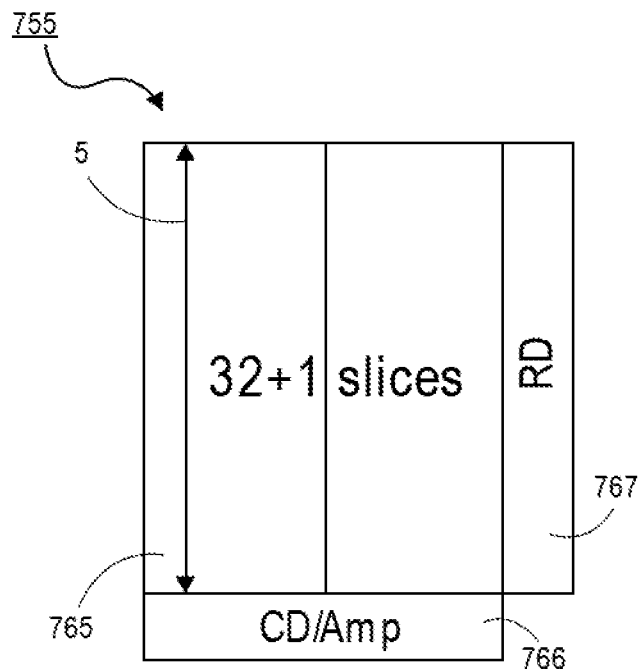
FIG. 7G is a block diagram illustration of a vertical bank architecture of a memory die, in accordance with an embodiment.

Meanwhile, in FIG. 7G, a block diagram illustration of a vertical bank architecture 755 of a memory die is shown, in accordance with an embodiment. The vertical bank structure 755 described herein may enable more banks in the column direction with a minimizing die area overhead. For example, the vertical bank structure 755 may the column decoder and amplifier 766 disposed in a perpendicular location as compared to a row direction 767 located vertically as each of the vertical slices 5 may form a vertical structure having, for example, 32+1 slices.

Figure 7H:
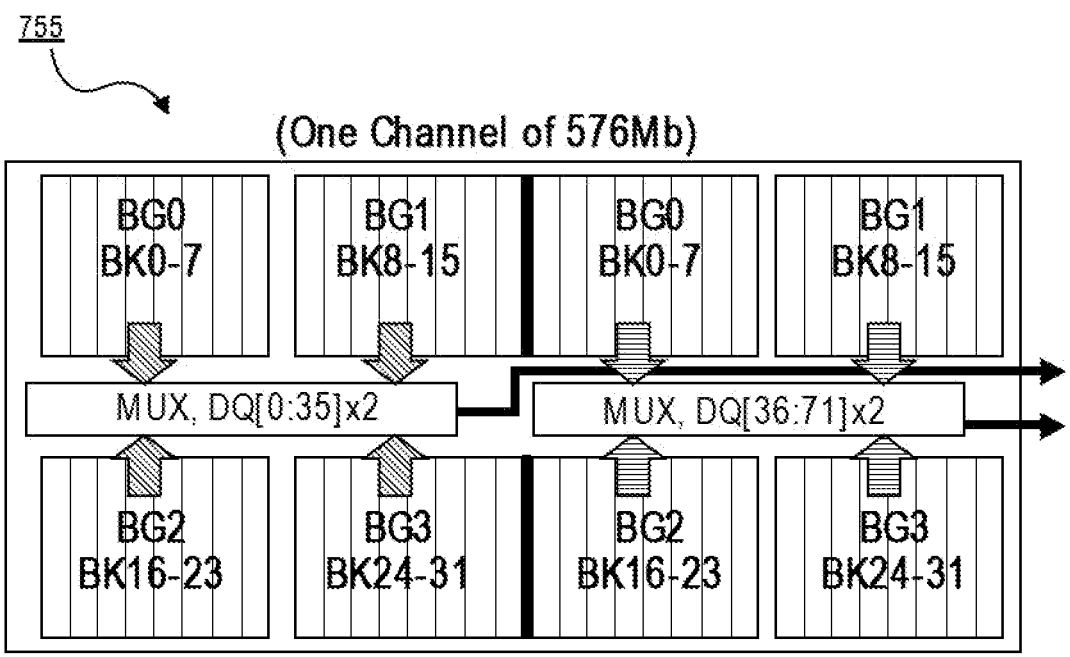
FIGS. 7H-7J are block diagram illustrations of a detailed vertical bank architecture of a memory die, in accordance with an embodiment.
Figure 7I:
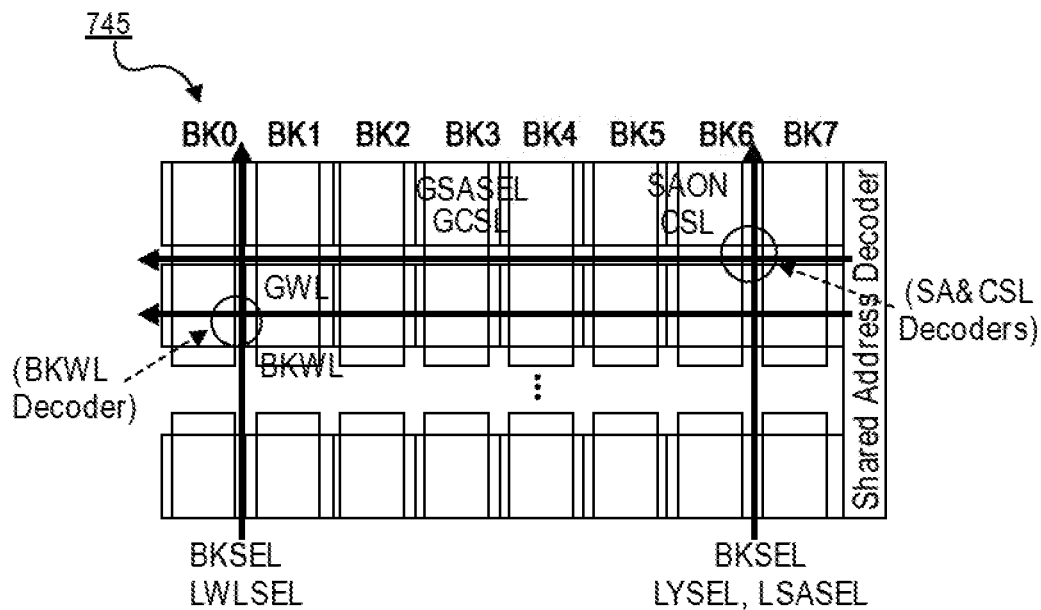
Figure 7J:
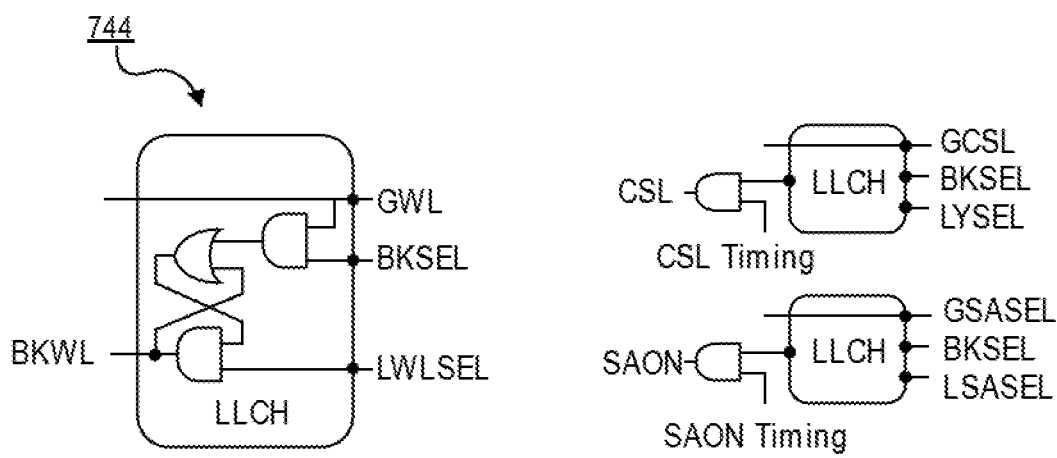
Figure 7K:
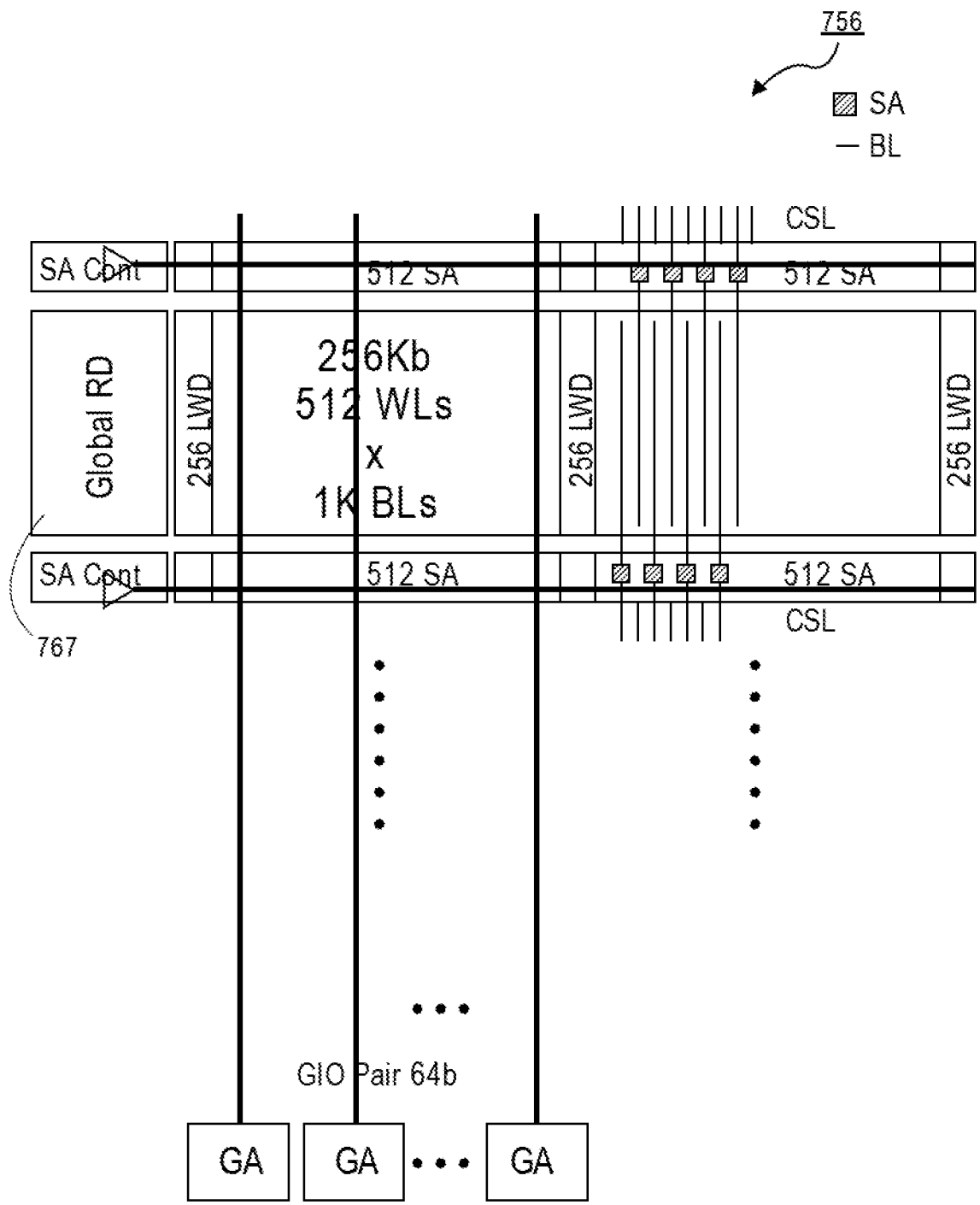
FIG. 7K is a block diagram illustration of a horizontal bank architecture of a memory die, in accordance with an embodiment.

As shown in FIGS. 7H-7J, the vertical bank architectures 755 and 744-745 further illustrate one or more detailed vertical bank arrangements that may be implemented by the memory dies described herein to enable memory expansion. For example, the arrangements of FIGS. 7H-7J may be combined to form a bank-group array structure. Moreover, these vertical bank architectures 755 and 744-745 may be combined with the horizontal CSL architecture 756 as depicted in FIG. 7K to form the memory dies described herein (e.g., the memory dies illustrated in FIGS. 1-6).

Below are one or more embodiments regarding the DRAM memory architectures and the ball-out interfaces of the memory dies. These memory dies may use a very short page size for each random access to reduce the row-cycle-access time. The memory dies may have one or more array architectures designed to improve low capacity, high bandwidth memory devices. A memory die may include a bank-group as illustrated in FIGS. 7F-7K which illustrates how the shared address decoding works.

For each bank-group a common set of row address decoders generates the global wordline (GWL) signal for all of the 8 banks in the same bank-group. The selected GWL is sampled by the bank-select pulse signal (BKSEL) in the bank-wordline (BKWL) decoder. The local-wordline-select (LWLSEL), it is used to decode the BKWL of the selected bank, which is latched in the BKWL decoder. Once the selected bank-wordline is latched, the shared row-address decoder is freed up to receive another address input from the next random access request. The bank-wordline is automatically de-selected at the falling edge of LWLSEL when the internal auto-pre-charge starts. The shared column address and the shared sense amplifier address decoding work in the same manner as the shared row address decoding. The turnaround time of the shared address decoder may be less than 3.2 ns. This circuit-sharing design results in a die size may increase of only 10% for a 32-bank array with respect to a conventional 4-bank array design.

The shared-address-decoder architecture naturally cuts down the page size to ⅛ of that in standard DRAM, which leads to the fact that only ⅛ of the memory cells, ⅛ of the columns, and ⅛ of the bit line sense amplifiers are activated during each random-access cycle. The smaller array data path parasitic and the smaller sense amplifier induced power supply kickback are the major contributors to latency reduction: from 30 to 17.3 ns and a 38 to 24 ns tRc reduction as shown in the timing budget analysis in. Since the power consumption of bank activation is also greatly reduced due to smaller total word line and bit line loadings, tFAw restriction in conventional DRAM is removed, so that the optimal random access bandwidth can be achieved.

Figure 8:
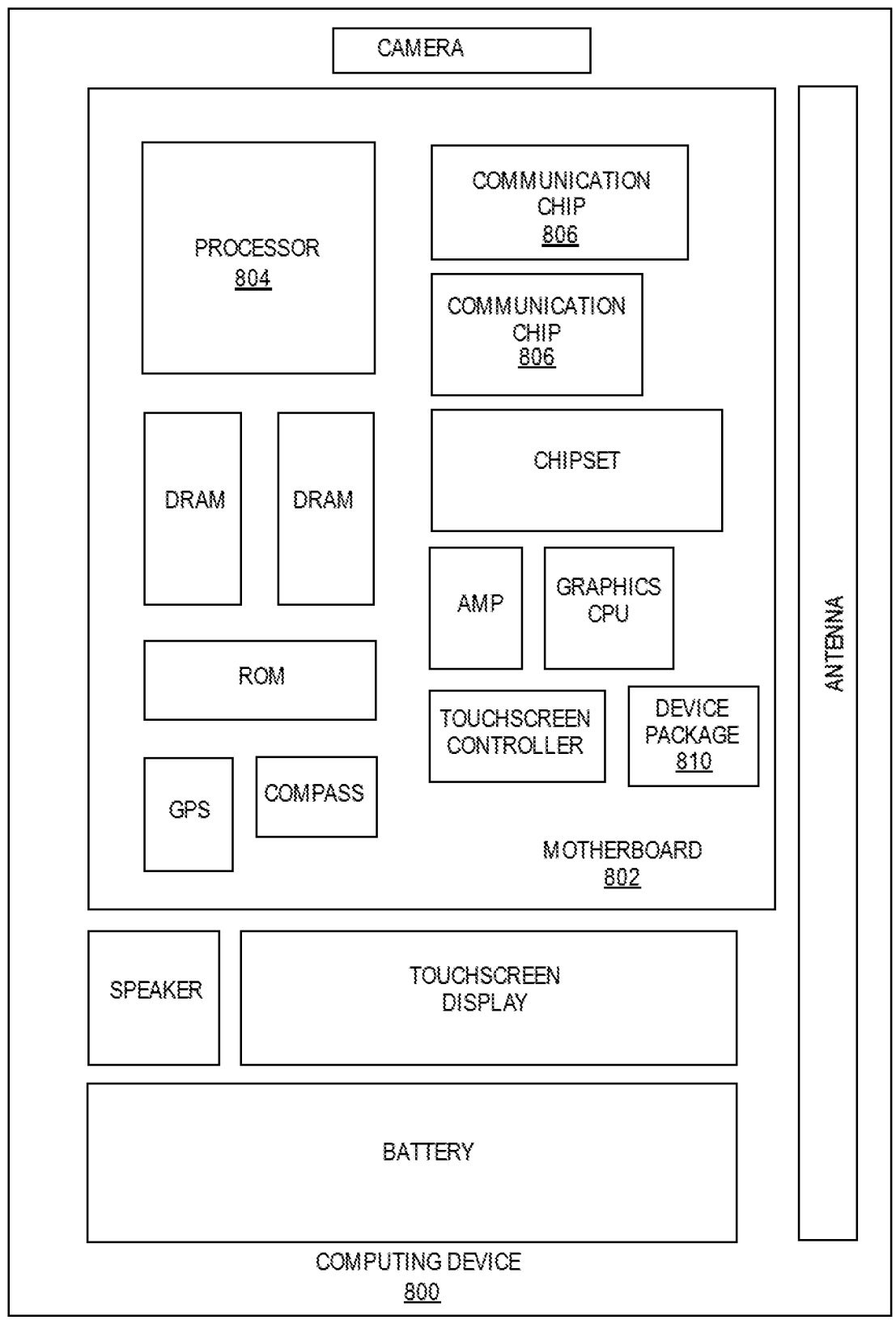
FIG. 8 is an illustration of a schematic block diagram illustrating a computer system that utilizes a device package having a memory module with through mold vias or passive interposers, according to one embodiment.

FIG. 8 illustrates a computing device 800 in accordance with one implementation of the invention. The computing device 800 houses a board 802. The board 802 may include a number of components, including but not limited to a processor 804 and at least one communication chip 806. The processor 804 is physically and electrically coupled to the board 802. In some implementations the at least one communication chip 806 is also physically and electrically coupled to the board 802. In further implementations, the communication chip 806 is part of the processor 804.

These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 806 enables wireless communications for the transfer of data to and from the computing device 800. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 806 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 800 may include a plurality of communication chips 806. For instance, a first communication chip 806 may be dedicated to shorter range wireless communications such as Wi-Fi and Bluetooth and a second communication chip 806 may be dedicated to longer range wireless communications such as GPS, EDGE, GPRS, CDMA, WiMAX, LTE, Ev-DO, and others.

The processor 804 of the computing device 800 includes an integrated circuit die packaged within the processor 804. In some implementations of the invention, the integrated circuit die of the processor may be packaged on a package substrate that comprises fibers with an off-angle orientation or on a package substrate that comprises a reinforcement layer with off-angle fiber orientations, in accordance with embodiments described herein. The term "processor" may refer to any device or portion of a device that processes electronic data from registers and/or memory to transform that electronic data into other electronic data that may be stored in registers and/or memory.

The communication chip 806 also includes an integrated circuit die packaged within the communication chip 806. In accordance with another implementation of the invention, the integrated circuit die of the communication chip may be packaged on a package substrate that comprises fibers with an off-angle orientation or on a package substrate that comprises a reinforcement layer with off-angle fiber orientations, in accordance with embodiments described herein.

The above description of illustrated implementations of the invention, including what is described in the Abstract, is not intended to be exhaustive or to limit the invention to the precise forms disclosed. While specific implementations of, and examples for, the invention are described herein for illustrative purposes, various equivalent modifications are possible within the scope of the invention, as those skilled in the relevant art will recognize.

These modifications may be made to the invention in light of the above detailed description. The terms used in the following claims should not be construed to limit the invention to the specific implementations disclosed in the specification and the claims. Rather, the scope of the invention is to be determined entirely by the following claims, which are to be construed in accordance with established doctrines of claim interpretation.

In the foregoing specification, embodiments have been described with reference to specific exemplary embodiments thereof. It should be borne in mind, however, that all of these and similar terms are to be associated with the appropriate physical quantities and are merely convenient labels applied to these quantities. It will be evident that various modifications may be made thereto without departing from the broader spirit and scope. The specification and drawings are, accordingly, to be regarded in an illustrative sense rather than a restrictive sense.

The following examples pertain to further embodiments. The various features of the different embodiments may be variously combined with some features included and others excluded to suit a variety of different applications.

The following examples pertain to further embodiments:

Example 1

A memory module, comprising: a first memory die having first interconnects with a first pad pitch and second interconnects with a second pad pitch, wherein the second pad pitch is less than the first pad pitch; a redistribution layer below the first memory die; a second memory die below the redistribution layer, wherein the second memory die has first interconnects with a first pad pitch and second interconnects with a second pad pitch; and a mold layer encapsulating the second memory die, wherein through mold interconnects provide an electrical connection from the redistribution layer to a bottom surface of the mold layer.

Example 2

The memory module of Example 1, wherein the through mold interconnects are through mold vias.

Example 3

The memory module of Examples 1-2, wherein the through mold interconnects are made through a passive interposer that is encapsulated in the mold layer.

Example 4

The memory module of Examples 1-3, wherein the passive interposer comprises silicon.

Example 5

The memory module of Examples 1-4, wherein the second interconnects of the first memory die are along an edge portion of the memory die.

Example 6

The memory module of Examples 1-5, further comprising an adhesive layer disposed between the second memory die and the redistribution layer, wherein the adhesive layer directly couples a top surface of the second memory die to a bottom surface of the redistribution layer.

Example 7

The memory module of Examples 1-6, wherein the second interconnects of the second memory die are along an edge portion of the memory die.

Example 8

The memory module of Examples 1-7, wherein the second interconnects of the first memory die are above the second interconnects of the second memory die, and wherein the first and second memory dies are high bandwidth low latency (HBLL) memory dies.

Example 9

The memory module of Examples 1-8, further comprising a second mold layer encapsulating the first memory die.

Example 10

An electronic package, comprising: a package substrate; a SoC die on the package substrate; a memory module on the package substrate, wherein the memory module comprises: a plurality of memory dies, wherein each die has first interconnects with a first pad pitch and second interconnects with a second pad pitch that is smaller than the first pad pitch; and a bridge substrate, wherein the second interconnects of the memory dies are electrically coupled to the SoC die by the bridge substrate.

Example 12

The electronic package of Examples 10-11, wherein the bridge substrate is embedded in the package substrate.

Example 13

The electronic package of Examples 10-12, wherein the bridge substrate is a passive substrate.

Example 14

The electronic package of Examples 10-13, wherein the bridge substrate is above the package substrate, and wherein the SoC die is above the bridge substrate.

Example 15

The electronic package of Examples 10-14, wherein the bridge substrate comprises active components.

Example 16

The electronic package of Examples 10-15, wherein the plurality of memory dies includes a first memory die and a second memory die, and wherein the first and second memory dies are HBLL memory dies.

Example 17

The electronic package of Examples 10-16, wherein the first memory die is encapsulated in a first mold layer, a redistribution layer is over the first mold layer, and the second memory die is over the redistribution layer.

Example 18

The electronic package of Examples 10-17, further comprising a through mold interconnect providing an electrical connection from the redistribution layer to a surface of the first mold layer opposite from the redistribution layer.

Example 19

The electronic package of Examples 10-18, wherein the through mold interconnect is a passive interposer.

Example 20

The electronic package of Examples 10-19, wherein the through mold interconnect is a through mold via.

Example 20

The electronic package of Examples 10-19, further comprising an interposer over the package substrate, and the interposer between the first mold layer and the package substrate, wherein the interposer includes a plurality of first through mold interconnects encapsulated in a second mold layer, wherein the interposer provides a second electrical connection from a surface of the second mold layer to the package substrate opposite from the surface of the second mold layer, or a third electrical connection from the package substrate to the surface of the first mold layer or to the redistribution layer, wherein the plurality of first through mold interconnects extend substantially vertically from the surface of the second mold layer to the package substrate, wherein the interposer electrically couples the package substrate to the first memory die, and wherein the interposer electrically couples the package substrate to the redistribution layer.

Example 21

A method of forming a memory module, comprising: disposing a first memory die onto a carrier substrate, wherein the first memory die has first interconnects with a first pad pitch and second interconnects with a second pad pitch, wherein the second pad pitch is less than the first pad pitch; disposing a mold layer encapsulating the first memory die; forming a redistribution layer over the mold layer; and disposing a second memory die above the redistribution layer, wherein the second memory die has first interconnects with a first pad pitch and second interconnects with a second pad pitch.

Example 22

The method of Example 21, further comprising: forming through mold interconnects through the mold layer to provide an electrical connection from the redistribution layer to a bottom surface of the mold layer.

Example 23

The method of Examples 21-22, wherein the through mold interconnects are conductive pillars, and wherein the first and second memory dies are HBLL memory dies.

Example 24

The method of Examples 21-23, wherein the through mold interconnects are on a passive interposer embedded in the mold layer.

Example 25

The method of Examples 21-24, further comprising an adhesive layer disposed between the second memory die and the redistribution layer, wherein the adhesive layer directly couples a top surface of the second memory die to a bottom surface of the redistribution layer.

In the foregoing specification, methods and apparatuses have been described with reference to specific exemplary embodiments thereof. It will be evident that various modifications may be made thereto without departing from the broader spirit and scope. The specification and drawings are, accordingly, to be regarded in an illustrative sense rather than a restrictive sense.

What is claimed is:

1. A memory module, comprising:
   a first memory die having first interconnects with a first pad pitch and second interconnects with a second pad pitch, wherein the second pad pitch is less than the first pad pitch;
   a redistribution layer below the first memory die;
   a second memory die below the redistribution layer, wherein the second memory die has first interconnects with a first pad pitch and second interconnects with a second pad pitch; and
   a mold layer encapsulating the second memory die, wherein through mold interconnects provide an electrical connection from the redistribution layer to a bottom surface of the mold layer.

2. The memory module of claim 1, wherein the through mold interconnects are through mold vias.

3. The memory module of claim 2, wherein the through mold interconnects are made through a passive interposer that is encapsulated in the mold layer.

4. The memory module of claim 3, wherein the passive interposer comprises silicon.

5. The memory module of claim 1, wherein the second interconnects of the first memory die are along an edge portion of the memory die.

6. The memory module of claim 1, further comprising an adhesive layer disposed between the second memory die and the redistribution layer, wherein the adhesive layer directly couples a top surface of the second memory die to a bottom surface of the redistribution layer.

7. The memory module of claim 5, wherein the second interconnects of the second memory die are along an edge portion of the memory die.

8. The memory module of claim 7, wherein the second interconnects of the first memory die are above the second interconnects of the second memory die, and wherein the first and second memory dies are high bandwidth low latency (HBLL) memory dies.

9. The memory module of claim 1, further comprising a second mold layer encapsulating the first memory die.

10. An electronic package, comprising:
    a package substrate;
    a SoC die on the package substrate;
    a memory module on the package substrate, wherein the memory module comprises:
      a plurality of memory dies, wherein each die has first interconnects with a first pad pitch and second interconnects with a second pad pitch that is smaller than the first pad pitch; and
      a bridge substrate, wherein the second interconnects of the memory dies are electrically coupled to the SoC die by the bridge substrate.

11. The electronic package of claim 10, wherein the bridge substrate is embedded in the package substrate.

12. The electronic package of claim 10, wherein the bridge substrate is in the package substrate, and wherein the SoC die is above the bridge substrate.

13. The electronic package of claim 10, wherein the plurality of memory dies includes a first memory die and a second memory die, and wherein the first and second memory dies are HBLL memory dies.

14. The electronic package of claim 13, wherein the first memory die is laterally surrounded by a first mold layer, a redistribution layer is over the first mold layer, and the second memory die is over the redistribution layer.

15. The electronic package of claim 14, further comprising a through mold interconnect providing an electrical connection from the redistribution layer to a surface of the first mold layer opposite from the redistribution layer.

16. The electronic package of claim 15, wherein the through mold interconnect is a through mold via.

* * * * *